(12) United States Patent
Chen et al.

(10) Patent No.: US 10,544,036 B2
(45) Date of Patent: Jan. 28, 2020

(54) MICROFLUIDIC DEVICES AND METHODS FOR THE EXTRUSION OF TUBULAR STRUCTURES

(71) Applicants: Haotian Chen, Toronto (CA); Mark Jeronimo, Kingston (CA); Adrianna McAllister, Toronto (CA); Axel Guenther, Toronto (CA)

(72) Inventors: Haotian Chen, Toronto (CA); Mark Jeronimo, Kingston (CA); Adrianna McAllister, Toronto (CA); Axel Guenther, Toronto (CA)

(73) Assignee: THE GOVERNING COUNCIL OF THE UNIVERSITY OF TORONTO, Toronto, ON (CA)

( * ) Notice: Subject to any disclaimer, the term of this patent is extended or adjusted under 35 U.S.C. 154(b) by 700 days.

(21) Appl. No.: 14/888,319

(22) PCT Filed: Apr. 30, 2014

(86) PCT No.: PCT/CA2014/050413
§ 371 (c)(1),
(2) Date: Oct. 30, 2015

(87) PCT Pub. No.: WO2014/176697
PCT Pub. Date: Nov. 6, 2014

(65) Prior Publication Data
US 2016/0068385 A1 Mar. 10, 2016

Related U.S. Application Data

(60) Provisional application No. 61/817,720, filed on Apr. 30, 2013.

(51) Int. Cl.
*B81C 1/00* (2006.01)
*B01L 3/00* (2006.01)

(52) U.S. Cl.
CPC .... *B81C 1/00119* (2013.01); *B01L 3/502707* (2013.01); *B01L 2200/12* (2013.01); *B01L 2300/0887* (2013.01)

(58) Field of Classification Search
CPC .................. B29C 47/0023; B81C 1/00119
See application file for complete search history.

(56) References Cited

U.S. PATENT DOCUMENTS 6,986,739 B2    1/2006   Warren et al.
7,051,654 B2    5/2006   Boland et al.
(Continued)

FOREIGN PATENT DOCUMENTS

| WO | 2011/080538 A1 | 7/2011 |
| WO | 2013/040078 A2 | 3/2013 |
| WO | 2013/040087 A2 | 3/2013 |

OTHER PUBLICATIONS

Buttafoco et al., "Electrospinning of Collagen and Elastin for Tissue Engineering Applications", Biomaterials, vol. 27, 2006, pp. 724-734.
(Continued)

*Primary Examiner* — Jonathan M Hurst
(74) *Attorney, Agent, or Firm* — Hill & Schumacher

(57) ABSTRACT

Methods and devices are disclosed for the controlled formation of structures, including tubular structures, using microfluidic devices. In one embodiment, a microfluidic device includes three or more microfluidic arrays that are provided in a stacking configuration, with an inner streaming layer and an outer streaming layer for flowing a streaming fluid, and at least one intermediate matrix layer for flowing a matrix fluid. Fluid flow in each layer is directed from a peripheral region towards, and distributed around, a common central outlet. Guided by the streaming fluid, a sheath of matrix solution is formed, which may be solidified to form a tubular material. Some embodiments allow for the
(Continued)

controlled and continuous extrusion of tubular structures with tailored heterogeneities and/or predictable mechanical and chemical properties. Devices and methods are also provided for the on- and off-chip fixation and optional perfusion of tubular structures.

40 Claims, 13 Drawing Sheets

(56) References Cited

U.S. PATENT DOCUMENTS

| | | | |
|---|---|---|---|
| 2007/0105972 | A1 | 5/2007 | Doyle et al. |
| 2011/0006453 | A1* | 1/2011 | Ying ............... A61L 27/52 264/171.27 |
| 2011/0287469 | A1 | 11/2011 | Guenther et al. |
| 2012/0089238 | A1 | 4/2012 | Kwang et al. |
| 2014/0306371 | A1 | 10/2014 | Guenther et al. |

OTHER PUBLICATIONS

Choi et al., "Microfluidic Fabrication of Complex-Shaped Microfibers by Liquid Template-Aided Multiphase Microflow", 16 Lab Chip, vol. 11, 2011, pp. 1477-1483.

Choi et al., "Microfluidic Scaffolds for Tissue Engineering", Nature Materials, vol. 6, Nov. 2007, pp. 908-915.

Gunther et al., "A Microfluidic Platform for Probing Small Artery Structure and Function", Lab on a Chip, vol. 10, 2010, pp. 2341-2349.

Hu et al., "Hydrodynamic Spinning of Hydrogel Fibers", Biomaterials, vol. 31, 2010, pp. 863-869.

Jakab et al., "Engineering biological structures of prescribed shape using self-assembling multicellular systems", Proceedings of the National Academy of Sciences of the United States of America, vol. 101, 2004, 2864-2869.

Jakab et al., "Tissue Engineering by Self-Assembly of Cells Printed into Topologically Defined Structures", Tissue Engineering Part A, vol. 14, 2008, pp. 413-421.

Jeong et al., "Hydrodynamic Microfabrication via"On the Fly" Photopolymerization of Microscale Fibers and Tubular Structures", Lab on a Chip, vol. 4, 2004, pp. 576-580.

Kang et a., "Digitally Tunable Physicochemical Coding of Material Composition and Topography in Continuous Microfibers", Nature Materials, vol. 10, 2011, pp. 877-883.

Kuo et al., "Lonically Crosslinked Alginate Hydrogels as Scaffolds for Tissue Engineering : Part 1 . Structure, Gelation Rate and Mechanical Properties", Biomaterials, vol. 22, 2001, pp. 511-521.

L'Heureux et al., "Human Tissue-Engineered Blood Vessels for Adult Arterial Revascularization", Nature Medicine, vol. 12, 2006, pp. 361-365.

Lan et al., "Controllable Preparation of Microscale Tubular Structures With Multiphase Co-Laminar Flow in a Double Co-Axial Microdevice" Lab on a Chip, vol. 9, 2009, pp. 3282-3288.

Leng et al., "Mosaic Hydrogels: One-Step Formation of Multiscale Soft Materials", Advanced Materials, vol. 24, 2012, pp. 3650-3658.

Marga et al., "Toward Engineering Functional Organ Modules by Additive Manufacturing", Biofabrication, vol. 4, 2012, pp. 1-12.

Mironov et al., "Bioprinting Living Structures", Journal of Materials Chemistry, vol. 17, 2007, pp. 2054-2060.

Moroni et al., "Polymer Hollow Fiber Three-Dimensional Matrices with Controllable Cavity and Shell Thickness", Biomaterials, vol. 27, 2006, pp. 5918-5926.

Norotte et al., "Scaffold-Free Vascular Tissue Engineering Using Bioprinting", Biomaterials, vol. 30, 2009, pp. 5910-5917.

Sugiura et al., "Tubular Gel Fabrication and Cell Encapsulation in Laminar Flow Stream Formed by Microfabricated Nozzle Array", Lab on a Chip, vol. 8, 2008, pp. 1255-1257.

Weinberg et al., "A Blood Vessel Model Constructed from Collagen and Cultured Vascular Cells", Science, vol. 231, 1986, pp. 397-400.

Yamada et al., "Microtluidic Synthesis of Chemically and Physically Anisotropic Hydrogel Microfibers for Guided Cell Growth and Networking", Soft Matter, vol. 8, 2012, pp. 3122-3130.

Yuan et al., "A Strategy for Depositing Different Types of Cells in Three Dimensions to Mimic Tubular Structures in Tissues", Advanced Materials. vol. 24, 2012, pp. 890-896.

\* cited by examiner

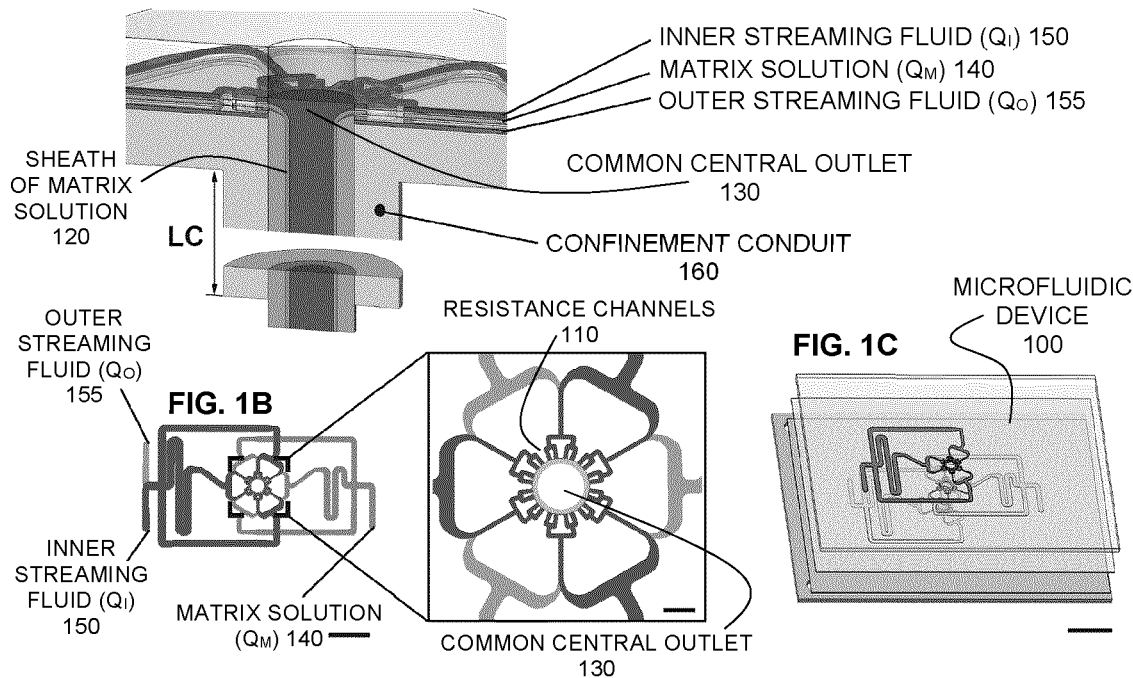
FIG. 1A
INNER STREAMING FLUID (Q_I) 150
MATRIX SOLUTION (Q_M) 140
OUTER STREAMING FLUID (Q_O) 155
SHEATH OF MATRIX SOLUTION 120
LC
COMMON CENTRAL OUTLET 130
CONFINEMENT CONDUIT 160
OUTER STREAMING FLUID (Q_O) 155
RESISTANCE CHANNELS 110
FIG. 1C
MICROFLUIDIC DEVICE 100
FIG. 1B
INNER STREAMING FLUID (Q_I) 150
MATRIX SOLUTION (Q_M) 140
COMMON CENTRAL OUTLET 130
FIG. 1D
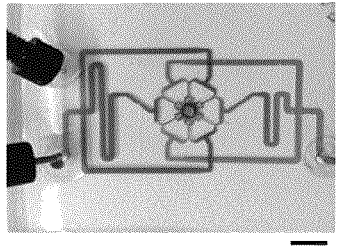
FIG. 1E
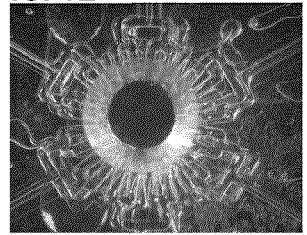
FIG. 1F
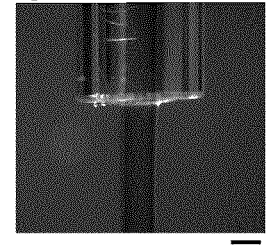

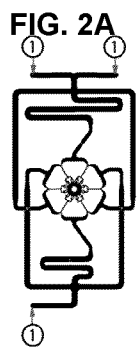
FIG. 2A
FIG. 2A(i)
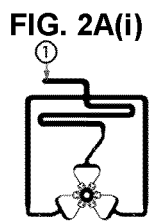
FIG. 2A(ii)
FIG. 2A(iii)
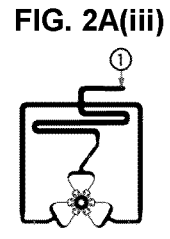
FIG. 2B
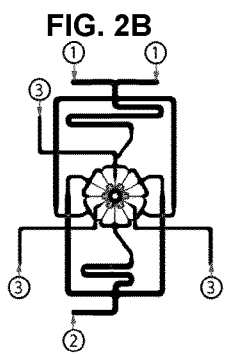
FIG. 2B(i)
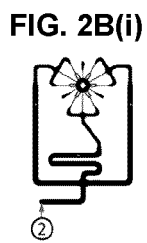
FIG. 2B(ii)
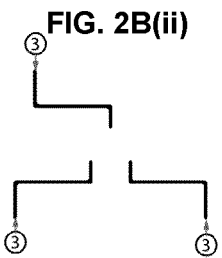
FIG. 2C
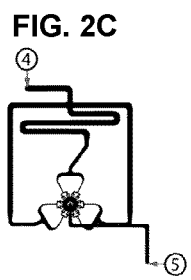
FIG. 2C(i)
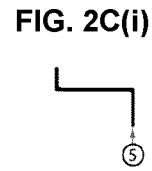
FIG. 2D
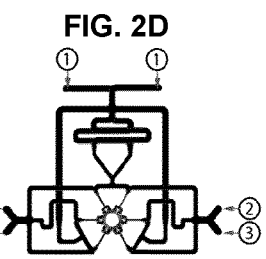
FIG. 2D(i)
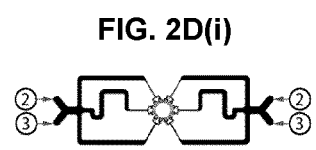
FIG. 2E
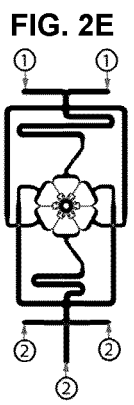
FIG. 2E(i)
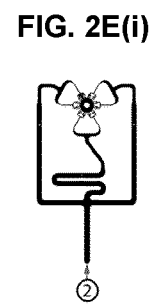
FIG. 2E(ii)
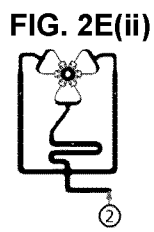
FIG. 2F
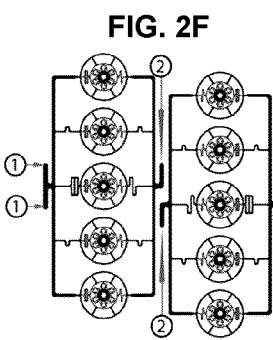
FIG. 2F(i)
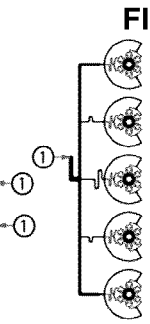
FIG. 2F(ii)
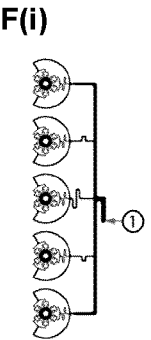
FIG. 2F(iii)
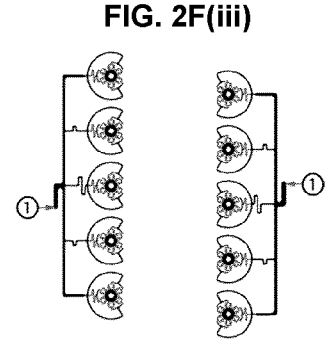

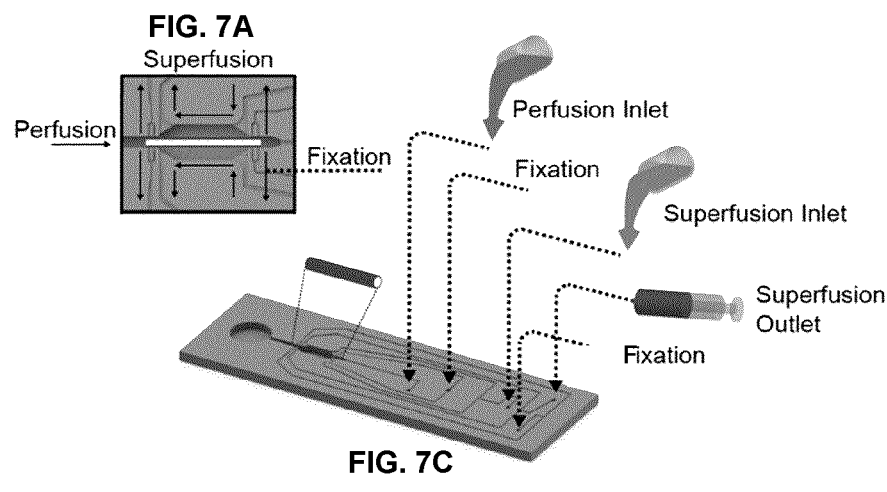
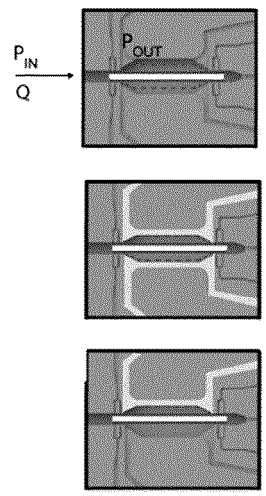
FIG. 7A
FIG. 7B
FIG. 7C

Shallow Region for Flow Resistance

MICROFLUIDIC DEVICES AND METHODS FOR THE EXTRUSION OF TUBULAR STRUCTURES

CROSS-REFERENCE TO RELATED APPLICATION

This application is a National Phase application claiming the benefit of the International PCT Patent Application No. PCT/CA2014/050413, filed on Apr. 30, 2014, in English, which claims priority to U.S. Provisional Application No. 61/817,720, titled "MICROFLUIDIC DEVICES AND METHODS FOR THE EXTRUSION OF TUBULAR STRUCTURES" and filed on Apr. 30, 2013, the entire contents of which are incorporated herein by reference.

BACKGROUND

The present disclosure relates to microfluidic methods and devices for forming structures from polymers and biopolymers. More particularly, the present disclosure relates to tubular biopolymer structures for biological applications. The present disclosure also relates to applications that include 3D cell culture and microphysiological systems for drug discovery, biomanufacturing of drugs and fuels, as well as molecular gastronomy.

Perfusable soft materials with complex geometries and defined heterotypic composition are abundant in nature. These tissues often possess a hierarchical architecture at length scales ranging from large molecules to several millimeters and often alter their structure and morphology over time. Examples of soft tissues in the body with similar composition and geometries include blood vessels (i.e. arteries, veins, and capillaries), the intestinal mucosa and airways (e.g. submucosa and bronchioles). Very few approaches exist which allow the spatial organization of soft matter into 3D tissues, specifically perfusable tubes, in a scalable format. The continuous production of microscale fibers and tubes is of particular interest in the generation of tissue engineered blood vessels and in cell-encapsulation for soft tissue applications[1,2].

The lack of scalable techniques to achieve a heterotypic composition is particularly evident at the micrometer to millimeter length scales which are of key importance for nutrient transport, cell-cell and cell-matrix interactions. Previously employed top-down fabrication approaches start from planar substrates and employ a series of processing steps (e.g., lithography, printing, engraving or direct writing) to ultimately obtain the desired heterotypic characteristics[3]. Bottom-up approaches are also possible, where microscale zero-dimensional and one-dimensional building blocks are assembled to form planar and 3-D assemblies[4].

There is great interest in technologies that enable the vascularization of bulk materials and engineered tissues while displaying adequate diffusive transport, displaying tunable mechanical and chemical properties, and displaying suitable biocompatibility and degradation rates[7,8]. Control of these factors is required to recapitulate the complex, highly localized, and dynamically evolving mechanical and chemical milieu of in vivo tissue properties. Highly organized 3D synthetic and natural extracellular matrix protein networks have been identified as key components of biomaterials needed to mimic the complex regulatory characteristics and temporal and spatial complexity of native tissues[9,10]. Achieving 3D spatio-temporal control of material geometry and properties presents a significant challenge in the formation of bioactive scaffolds.

SUMMARY

Methods and devices are disclosed for the controlled formation of structures, including tubular structures, using microfluidic devices. In one embodiment, a microfluidic device includes three or more microfluidic arrays that are provided in a stacking configuration, with an inner streaming layer and an outer streaming layer for flowing a streaming fluid, and at least one intermediate matrix layer for flowing a matrix fluid. Fluid flow in each layer is directed from a peripheral region towards, and distributed around, a common central outlet. Guided by the streaming fluid, a sheath of matrix solution is formed, which may be solidified to form a tubular material. Some embodiments allow for the controlled and continuous extrusion of tubular structures with tailored heterogeneities and/or predictable mechanical and chemical properties. Devices and methods are also provided for the on- and off-chip fixation and optional perfusion of tubular structures.

Accordingly, in one aspect, there is provided a method of forming a tubular polymeric material with a microfluidic device, the microfluidic device comprising:

at least two microfluidic layers, wherein the microfluidic layers are provided in a stacked configuration, the at least two microfluidic arrays comprising:
  an inner streaming fluid microfluidic layer; and
  a matrix microfluidic layer;
  wherein the matrix microfluidic layer is provided adjacent to the inner streaming fluid microfluidic layer;
  wherein the microfluidic layers comprise at least one microfluidic channel in fluid communication a common central outlet, such that fluid flow in each layer is directed inwardly from a peripheral region towards, and distributed around, the common central outlet;

the method comprising:
  flowing inner streaming fluid to the inner streaming fluid microfluidic layer, and matrix solution to the matrix microfluidic layer, such that a tubular sheath of matrix solution is extruded from the common central outlet into a liquid reservoir in a direction out of a plane defined by the matrix microfluidic layer, and such that the inner streaming fluid flows within a lumen defined by the tubular sheath of matrix solution, thereby guiding the tubular sheath of matrix solution; and
  solidifying the tubular sheath of matrix solution into a tubular material as it is extruded from the common central outlet into the liquid reservoir.

In another aspect, there is provided a microfluidic device comprising: at least two microfluidic layers, wherein said microfluidic layers are provided in a stacked configuration, said at least two microfluidic layers comprising:
  an inner streaming fluid microfluidic layer for flowing an inner streaming fluid;
  a matrix microfluidic layer for flowing a matrix solution; and
  wherein said matrix microfluidic layer is provided adjacent to said inner streaming fluid microfluidic layer;
  wherein the microfluidic layers comprise at least one microfluidic channel in fluid communication a common central outlet, such that fluid flow in each layer is directed inwardly from a peripheral region towards, and distributed around, the common central outlet, and such that a tubular sheath of matrix solution is extruded from said common central outlet in a direction out of a plane defined by said matrix layer;

wherein said microfluidic layers are configured such that the inner streaming fluid flows within a lumen defined by the tubular sheath of matrix solution, thereby guiding the tubular sheath of matrix solution.

In another aspect, there is provided a microfluidic system comprising a microfluidic system for forming tubular polymeric structures, comprising:

a microfluidic device as described above;

an inner streaming dispensing device for dispensing the inner streaming fluid to said inner streaming fluid microfluidic layer; and one or more matrix dispensing devices for dispensing matrix solution to said matrix microfluidic layer.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which:

FIGS. 1A-G show (a) 3D sectioned model of an example microfluidic device at the extrusion hole during matrix extrusion through a confining tube of length $L_c$.(b) Layout of three-layer extrusion device; from top-down: inner fluid, matrix solution and outer fluid. The channels from different layers are on top of each other at some locations. (Scale bar 1 cm(left), 2 mm(right)) (c) Example assembly schematic of the three layers and confinement piece. (Scale bar 1.5 cm) (d) Photograph of example polydimethylsiloxame (PDMS) device with dye-filled channels. (Scale bar 1 cm) (e) Photograph of resistance channels at extrusion outlet taken with top camera. (Scale bar 1 mm) (f) Photograph taken with side view camera demonstrating continuous tubular structure extrusion through confining tube. (Scale bar 2 mm) (g) Example apparatus including fluidic control, the microfluidic device, confinement at extrusion outlet, and a liquid filled reservoir. (Scale bar 1.5 inch)

FIGS. 2A-F show various example microfluidic device designs. FIG. 2A shows the design of an example homogeneous tubular structure extrusion device consists of 3 feature layers. The feature layers are from top down: inner streaming layer (FIG. 2A(i)), matrix layer (FIG. 2A(ii)) and outer streaming layer (FIG. 2A(iii)). FIG. 2B shows the design of an example tubular structure extrusion device for forming tubular structures with 3 circumferential spots, where the device consists of 4 feature layers from top down, formed from layers including matrix solution feeding layer (FIG. 2B(ii)), inner streaming layer (FIG. 2A(i)), additional matrix layer with 3 spotting channels (FIG. 2B(i)) and outer streaming layer (FIG. 2A(iii)). FIG. 2C shows the design an example off-chip fixation device, consisting of 2 feature layers from top down, including perfusion solution feed layer (FIG. 2C(i)) and vacuum fixation layer (FIG. 2A(i)). FIG. 2D shows the design of an example extrusion device for forming a heterogeneous tubular structure with different compositions on each half of the tubular structure, consisting of 3 layers from top down, including inner streaming layer (FIG. 2A(i)), half-half matrix layer with 2 inlets for each half (FIG. 2D(i)) and outer streaming layer (FIG. 2A(iii)). FIG. 2E shows the design of an example device for forming a tubular structure having three coaxial layers, the device consisting of 3 layers from top down, including inner streaming layer (FIG. 2A(i)), matrix layer 1 (FIG. 2A(ii)), matrix layer 2 (FIG. 2E(i)), matrix layer 3 (FIG. 2E(ii)) and outer streaming layer (FIG. 2A(iii)). FIG. 2F shows the design of an example extrusion device for the extrusion of 10 single layer homogeneous, tubular structures, where the device consists of 3 layers from top down, including inner streaming layer (FIG. 2F(i)), matrix layer (FIG. 2F(ii)) and outer streaming layer (FIG. 2F(iii)). Inlets are labeled as follows: streaming fluid inlet (1), matrix solution 1 inlet (2), matrix solution 2 inlet (3), vacuum inlet (4), perfusion fluid inlet (5).

FIG. 3A shows: Left: Cross-sectional view of example device at the tubular structure extrusion outlet with fluid flows $Q_I$, $Q_M$ and $Q_O$ forming a tubular structure of outer diameter $D_O$ and inner diameter $D_I$. The tubular structure, fully polymerized after distance L, extrudes along x at velocity V, when confined by a confinement conduit of diameter $D_C$ and length $L_C$. Right: Velocity profile at device outlet in the case of confined extrusion, calculated from numerical model (solid line for parabolic flow profile and dotted for linear profile between tubular structure and confinement wall). FIG. 3B demonstrates the operating window of $Q_I$ and $Q_O$ for successful tubular structure formation at $Q_M$=200 uL/min for the example device shown. Tubular structures were formed at points marked with hollow circles and not formed at the solid circles. FIG. 3C shows a confocal image of cross section of homogeneous alginate tubular structure formed at $Q_I$=500 µL/min, $Q_m$=200 µL/min and $Q_o$=800 µL/min. The tubular structure outer diameter is 1300 µm. (Scale bar 500 µm) FIG. 3D shows a confocal image of cross section of homogeneous alginate tubular structure formed at $Q_I$=650 µL/min, $Q_m$=200 µL/min and $Q_o$=650 µL/min. The tubular structure outer diameter is 1600 µm. (Scale bar 500 µm) FIG. 3E shows a confocal image of cross section of homogeneous alginate tubular structure formed at $Q_I$=1200 µl min, $Q_m$=200 µL/min and $Q_o$=100 µL/min. The tubular structure outer diameter is 2200 µm. (Scale bar 500 µm) FIG. 3F shows the relationship between tubular structure dimensions and flow rates. $Q_I$ kept constant at 200 µL/min. Symbols are provided as follows: □ outer diameter, top curve is the predicted outer diameter, ○ inner diameter, mid curve is the predicted inner diameter, Δ wall thickness, bottom curve is the predicted wall thickness. FIG. 3G shows the relationship between tubular structure dimensions and flow rates. $Q_I$ kept constant at 200 µL/min. The inner fluid contains no crosslinker. □ outer diameter, -■- outer diameter (No crosslinker in ineer fluid), ○ inner diameter, -●- inner diameter (No crosslinker in inner fluid), Δ wall thickness (No crosslinker in inner fluid), -▲- wall thickness.

FIG. 4A shows a confocal image of cross section of tri-layer alginate tubular structure formed at $Q_I$=1200 µL/min, $Q_m^1$=67 µL/min, $Q_m^2$=67 L/min, $Q_m^3$=67 L/min and $Q_o$=100 µL/min. (Scale bar 500 µm)

µL/min, $Q_m$=200 µL/min and $Q_o$=650 µL/min. Spotting channel has pressure of 1 Psi. (Scale bar 500 µm) FIG. 4N shows a schematic of an example tubular structure with pores on the tubular structure wall. The morphology can be obtained when a non-polymerizing (non-gelling) secondary solution is selected as the secondary matrix material.

FIG. 5A shows an example extruded tubular structure with a circumferential array of adjacent internal tubular structures, formed with the following conditions: $Q_I$=1200 µL/min, $Q_m^1$=120 µL/min, $Q_m^2$=120 µL/min, $Q_m^3$=120 µL/min and $Q_o$=100 µL/min. Inner and outer matrix are alginate while mid matrix is collagen. FIGS. 5H-5O illustrate example device designs for producing the structures shown in FIGS. 5D-5G.

FIG. 6A shows a schematic of an example tubular structure hosting device, labeled as follows 1: Sealing regions where vacuum is applied to hold the device; 2: Fixation channels where vacuum is applied to hold the tubular structure; 3: Superfusion channels which flow fluids along the outer wall of the tubular structure; 4: Perfusion channels which flow fluids through the tubular structure (Scale bar 5 mm). FIG. 6B shows a photo of an example fixation device that was fabricated. FIG. 6C shows a 3-D rendering of an example tubular structure hosting device with isolated fixation and vacuum channels. Scale bar 5 mm. (Scale bar 5 mm). FIG. 6D shows a 3-D rendering of an example tubular structure hosting device with connected fixation and vacuum channels (Scale bar 5 mm). FIG. 6E shows a photograph of an example device-hosted 2% alginate tubular structure during active perfusion of DI water from a hydrostatic reservoir at 60 mmHg and a superfusion flow rate of 2 ml/hr (Scale bar 500 µm). FIG. 6F shows a photograph of an example device-hosted 2% alginate tubular structure during active perfusion of 2.5% v/v 1 µm fluorescent beads from a hydrostatic reservoir at 60 mmHg and a superfusion flow rate of 2 ml/hr (Scale bar 600 µm). FIG. 6G shows a photograph of an example device-hosted 2% alginate tubular structure during active superfusion of 2.5% v/v 1 µm fluorescent beads at a superfusion flow rate of 2 ml/hr and perfusion from a hydrostatic reservoir at 60 mmHg (Scale bar 600 µm). FIG. 6H shows a schematic of an example off-chip fixation device. FIG. 6I is a photo of a hydrogel tubular structure held by an example off-chip fixation device. FIG. 6J is a schematic of tubular structure elongation using an example off-chip fixation device. FIG. 6K is a schematic of segmented flow perfusion of a hydrogel tubular structure using an example off-chip fixation device. FIG. 6L is a schematic of an example off-chip fixation device holding multiple tubular structures. FIG. 6M is a schematic of an example off-chip fixation device holding both ends of a tubular structure.

FIGS. 7A-C show (7A) a schematic of an example device to fixate, perfuse, and superfuse isolated tubular structure segments on-chip; inset: close-up view of tubular structure fixation area; (7B) a schematic of increasing transmural pressure and its effect on tubular structure diameter and passive resistance (expansion shown in dotted lines); (7C) top: schematic of symmetric material swelling of active resistor by altering abluminal conditions (shown in white); bottom: schematic of asymmetric material swelling of active resistor by altering abluminal conditions (shown in white);

FIG. 8A illustrates an example implementation of the perfusion of multiple tubular structures, where the tubular structures are embedded in a scaffold. $Q_1$ is the flow rate of perfusion fluid going into the tubular structures. $Q_2$ is the flow rate of perfusion fluid coming out from the tubular structures. $P_v$ is the negative pressure applied to the fixation channels of the devices. $D_o$ is the diameter of fixation hole of the device. C is the distance between two fixation holes. $L_A$ is the width of the scaffold. $H_A$ is the width of the scaffold. FIG. 8B illustrates an example implementation of the perfusion of multiple tubular structures arranged in two different directions, where the tubular structures are molded in a scaffold. $Q_{1a}$ is the flow rate of perfusion fluid going into the tubular structures in the up-down direction. $Q_{1b}$ is the flow rate of perfusion fluid coming out from the tubular structures in the up-down direction. $Q_{2a}$ is the flow rate of perfusion fluid going into the tubular structures in the left-right direction. $Q_{2b}$ is the flow rate of perfusion fluid coming out from the tubular structures in the left-right direction. FIG. 8C illustrates an example implementation of the perfusion of alternating tubular structures with different fluids, where the tubular structures are molded in a scaffold. $Q_1$ is the flow rate of perfusion fluid 1 going into the tubular structures. $Q_2$ is the flow rate of perfusion fluid 1 coming out from the tubular structures. $Q_1$ is the flow rate of perfusion fluid 2 going into the tubular structures. $Q_2$ is the flow rate of perfusion fluid 2 coming out from the tubular structures. FIG. 8D illustrates an example implementation of the perfusion of a tubular structure molded in the wall of a tubular scaffold made of stimulus responsive material.

DETAILED DESCRIPTION

Figure 1G:
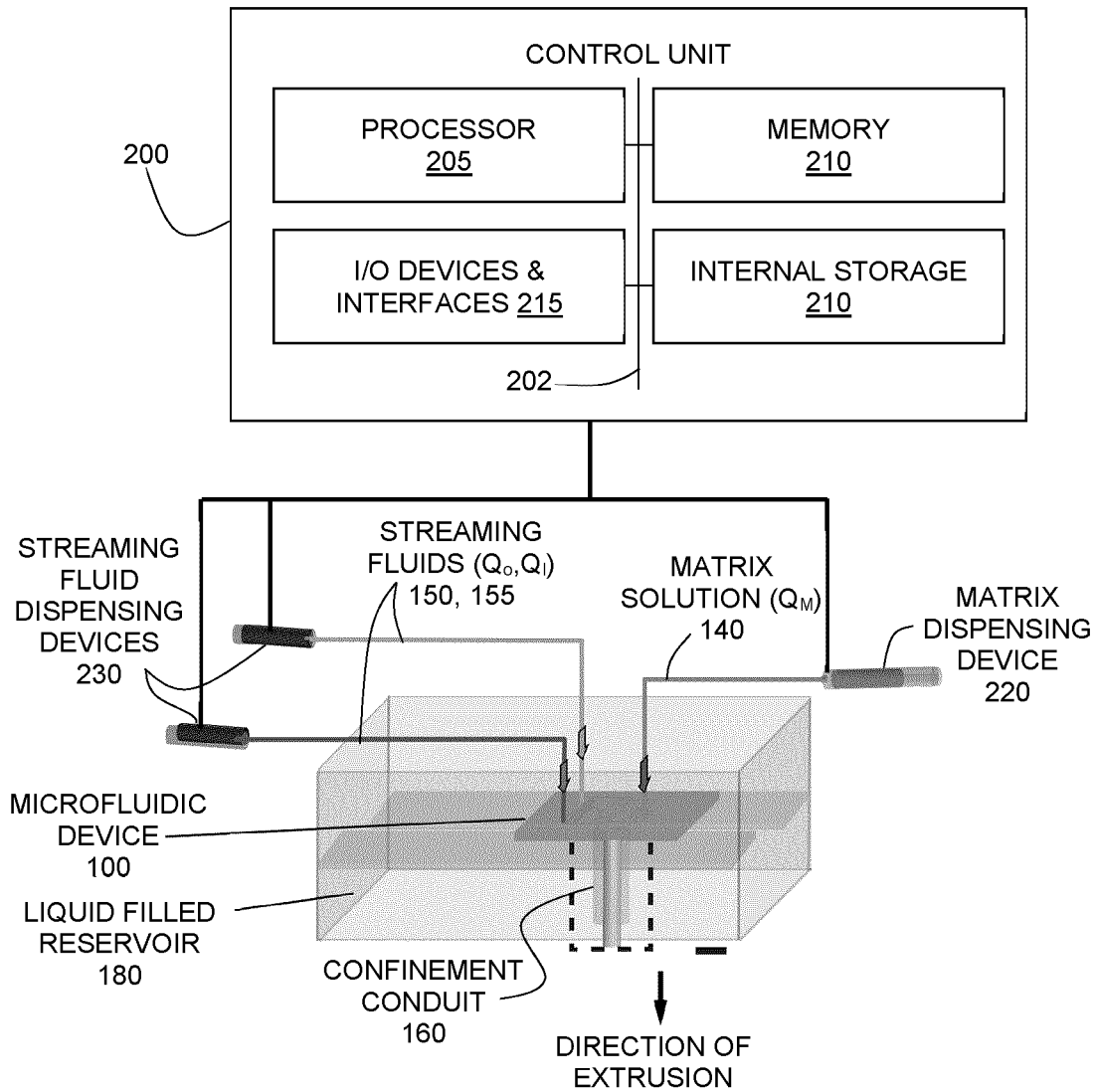

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms, "comprises" and "comprising" are to be construed as being inclusive and open ended, and not exclusive. Specifically, when used in the specification and claims, the terms, "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. In one non-limiting example, the terms "about" and "approximately" mean plus or minus 10 percent or less.

As used herein, the phrase "microfluidic" refers to a device, or a fluidic component of a device, that is configured for containing, flowing, processing, or otherwise manipulating of small volumes of liquid, such as in the sub-picoliter to sub-milliliter, or milliliter range. In some example embodiments, the maximal cross-sectional dimension of a microfluidic feature, such as a microfluidic channel, may be less than 1 mm, less than 500 microns, less than 100 microns, less than 50 microns, or less than 25 microns.

As used herein, the term "biopolymer" is understood to encompass naturally occurring polymers, as well as synthetic modifications or derivatives thereof. Such biopolymers include, without limitation, natural and synthetic proteins as well as mixtures thereof, hyaluronic acid, collagen, recombinant collagen, cellulose, elastin and elastin-mimetic materials, agarose, gelatin, alginates, chondroitin sulfate, chitosan, chitin, keratin, silk, blends thereof as well as physical and chemical modifications of thereof.

As used herein, the phrases "polymer solution" and "polymerizable matrix solution" refers to a solution containing a polymerizable substance. Examples of polymers include thermoplastics as well as thermoplastic elastomers. Similarly, the phrase "biopolymer solution" refers to a solution containing a substance that is polymerizable into a biopolymer.

In the present disclosure, methods, apparatus and systems are described that provide a scalable approach for the in-flow formation and extrusion of tubular structures with different architectures and heterogeneities, as well as methods for assembling these tubular structures into perfusable and stimulus-responsive bulk materials.

FIG. 1A illustrates the formation and extrusion of a soft tubular material using a microfluidic device. One or more matrix solutions, such as biopolymer solutions, and streaming fluid (shown as inner streaming fluid and outer streaming fluid), are introduced to the microfluidic device and are spatially organized within the device to form a complex fluid at the a common central outlet, where the matrix solutions of the complex fluid retain their spatial organization and are directed out of the plane of the device, forming a liquid sheath of matrix solution that is guided by the streaming fluids. After the extrusion of the sheath of matrix liquid from the central opening, the sheath may be hardened to form a solid tubular structure.

It will be understood that the the tubular structure may solidified according to any solidification method or mechanisms, including, but not limited to, polymerization (e.g. crosslinking or other forms of polymerization), or other forms of hardening (e.g. glass transition of by change temperature of amorphous materials) or solidification (e.g. change in solubility causing precipitation).

In some example implementations, the diameter of the extruded sheath of matrix solution may be defined by an optional confinement conduit that is in fluid communication with the central common outlet. The confinement is not essential for tubular structure formation but may be beneficial for controlling tubular structure dimensions during extrusion. This allows for the controlled and continuous extrusion of tubular structures with tailored heterogeneities and predictable mechanical and chemical properties.

As further described below, the properties of the extruded tubular structures, such as the diameter and wall thickness, may be varied by controlling one or more process parameters such as material composition (e.g. viscosity), microfluidic channel diameter, and flow rate.

FIG. 1B shows an example embodiment illustrating the design of a single layer homogeneous tubular structure extrusion microfluidic device. Other designs for extruding more complex tubular structure structures are described below. As shown in FIG. 1C, the illustrated microfluidic device 100 includes three microfluidic arrays provided in a stacking configuration, with the inner streaming layer, an intermediate matrix layer, and outer streaming layer stacked in a top-down configuration (other embodiments may include additional matrix layers, as further described below). Fluid flow in each layer is directed from the periphery to the center. The inlet channel of each layer splits evenly into an array of microfluidic channels, where each channel is directed inwardly from a peripheral region towards, and distributed around, a common central outlet 130, and is extruded in a distributed (e.g. radial) configuration around the common central outlet 130 (for example, a ⅛" hole), ensuring that a connected tubular structure is formed. In one embodiment, resistance channels 110 of each microfluidic array provide uniform flow distribution around the common outlet hole. The common hole connects the three different fluid-carrying layers and provides outflow through the bottom of the device and into the reservoir 180, such that a flowing sheath of matrix solution 120 is extruded from the common central outlet 130 in a direction out of a plane defined by the intermediate matrix layer. The inner streaming fluid occupies the lumen defined by the sheath of matrix solution, and the outer streaming fluid externally envelops the flowing sheath of matrix solution 130.

As described further below, in one example implementation, the tubular structure may be polymerized if the streaming fluid is a cross-linking solution that causes cross-linking and polymerization of the sheath of matrix solution during its extrusion. In other words, guided and supported by the inner and outer streaming layers, a flowing sheath of the matrix solution is formed, and a flowing soft material tubular structure is formed by hardening the matrix solution, for example, by cross-linking via inter diffusion from the streaming fluids.

An example method of fabrication of the device shown in FIG. 1B is illustrated in FIG. 1C. The device may be fabricated by stacking layers of devices using a previously described technique called multilayer soft lithography. A photograph of a device formed according to this example method, using PDMS, is shown in FIG. 1D. Each layer of the device feeds solutions into the center punched hole (FIG. 1F), and distribute the solutions equally along the circumferences to ensure uniform wall thickness of the tubular structures produced. The fluids immediately enter a confinement channel after leaving the device exit. Crosslinking of the biopolymer is continues while the fluids are travelling through the confinement. FIG. 1F shows a side view of a tubular structure leaving the confinement channel.

It will be understood that the microfluidic devices described herein may be formed from a multitude of different materials, according to various known processing methods. For example, in some embodiments, microfluidic devices may be fabricated from silicones such as PDMS, as described above. In alternative embodiments, microfluidic devices may be formed from, for example, materials including, but not limited to, polymers (e.g., poly(dimethylsiloxane) (PDMS), polystyrene, poly(methyl methacrylate) (PMMA), and biopolymers such as fibrinogen, collagen, laminin and combinations thereof), glass, semiconductors (e.g., silicon or gallium arsenide), metals, ceramics, and combinations thereof.

Typically, the channels and structures of the module may be etched, embedded, molded or otherwise formed on the surface of one half of the base. That surface may then be bonded against the other half of the base, for example using techniques such as free-radical surface activation in a plasma and subsequent bonding, solvent bonding, compression bonding, or anodic bonding. Other common methods and variations for making microfluidic devices may be suitable. The device may be made from single-layer designs, or from two- or multi-layer designs, in which each layer provides at least a portion of the module or at least a portion of a channel connection to the module.

Referring to FIG. 1G, an example microfluidic device 100 is illustrated for forming and extruding tubular structures. The extrusion of the tubular structure into a liquid reservoir 180 employs two focusing streams, inner 150 and outer streaming fluids 155, to define the shape of the tubular structures formed from a matrix fluid 140. As shown in the figure, the example microfluidic device has three inlets and one common central outlet 130, and is immersed in a liquid filled container 180.

The matrix solution 140 may be supplied by one or more matrix dispensing devices 220 (e.g. syringe or gear pump) for controlling the flow rate $Q_M$ and/or composition of the dispensed matrix solution. For example, in some embodiments, multiple matrix dispensing devices may be separately interfaced with different matrix microfluidic channels, within one or more matrix microfluidic arrays. Inner streaming fluid 150, with flow rate $Q_I$, and an outer streaming solution 155, with flow rate $Q_O$, may be supplied by streaming solution dispensing devices 230. As noted below, in some embodiments, tubular structures may be formed without the need for outer streaming solution, and therefore a single streaming fluid dispensing device may be employed in such embodiments. Alternatively, the matrix solution and streaming fluid(s) may be supplied by controlling the head pressures of respective liquid reservoirs.

Matrix dispensing device(s) 220 and streaming fluid dispensing devices 230 may be controlled by control unit 200, for example, for controlling the flow rate and/or composition of the dispensed fluids. In other embodiments involving fixation that are described below, control unit 200 may additionally or alternatively be interfaced with one or more pressure regulation devices (e.g. pumps) for producing a vacuum or negative pressure. As shown in the figure, example control unit 200 includes one or more processors 205 (for example, a CPU/microprocessor), a bus 202, memory 260, which may include random access memory (RAM) and/or read only memory (ROM), one or more input/output devices and/or interfaces 210 (e.g. a user input device, such as a keyboard, a keypad, a mouse), and optionally one or more internal storage devices 215 (e.g. a hard disk drive, compact disk drive or internal flash memory), and a power supply (not shown). Control unit 200 may include additional components, such as one or more communications interfaces and external storage.

Although only one of each component within control unit 200 is illustrated in FIG. 3, more than one of some components can be included in control unit 200. For example, a computer typically contains a number of different data storage media. Furthermore, although bus 252 is depicted as a single connection between all of the components, it will be appreciated that the bus 252 may represent one or more circuits, devices or communication channels which link two or more of the components. For example, in personal computers, bus 252 often includes or is a motherboard.

In one embodiment, control unit 200 includes a general purpose computer or any other hardware equivalents that is programmed to perform the methods disclosed herein. Control unit 200 may also be implemented as one or more physical devices that are coupled to processor 255 through one of more communications channels or interfaces. For example, components of control unit 200 can be implemented using application specific integrated circuits (ASICs). Alternatively, control unit 200 can be implemented as a combination of hardware and software, where the software is loaded into the processor from the memory or over a network connection. Control unit 200 may be programmed with a set of instructions which when executed in the processor 255 causes the system to perform one or more methods described in the disclosure. Control unit 200 may include many more or less components than those shown.

While some embodiments have been described in the context of fully functioning computers and computer systems, those skilled in the art will appreciate that various embodiments are capable of being distributed as a program product in a variety of forms and are capable of being applied regardless of the particular type of machine or computer readable media used to actually effect the distribution.

A computer readable medium can be used to store software and data which when executed by a data processing system causes the system to perform various methods. The executable software and data can be stored in various places including for example ROM, volatile RAM, non-volatile memory and/or cache. Portions of this software and/or data can be stored in any one of these storage devices. In general, a machine-readable medium includes any mechanism that provides (i.e., stores and/or transmits) information in a form accessible by a machine (e.g., a computer, network device, personal digital assistant, manufacturing tool, any device with a set of one or more processors, etc.).

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., compact discs (CDs), digital versatile disks (DVDs), etc.), among others. The instructions can be embodied in digital and analog communication links for electrical, optical, acoustical or other forms of propagated signals, such as carrier waves, infrared signals, digital signals, and the like.

As shown in the figures, the extrusion is performed such that the extruded tubular structure emerges along flow a path that is not within of the flow plane of the matrix and streaming solutions, and angled relative to the flow plane of the matrix and streaming solutions. For example, in many of the example embodiments illustrated herein, the matrix and streaming fluids flow in a series of parallel flow planes, and merge to form the complex fluid that is polymerized or otherwise hardened to produce the tubular structure, such that the complex fluid formed by the merging of the matrix and streaming fluids flows in a direction that is approximately orthogonal to the initial flow planes of the matrix and streaming fluids. This redirecting of flow during the formation of the complex fluid allows for the formation of a tubular liquid sheath (e.g. cylindrical) having a core-shell fluid flow profile that subsequently forms the tubular structure upon solidification.

Although many of the example implementations described and illustrated herein show stacked horizontal planar microfluidic arrays with microfluidic channels distributed around and connected to a central circular vertical output channel, it is to be understood that other geometric configurations are possible without departing from the scope of the present disclosure. In other words, other device geometrical configurations are possible for forming tubular structures whereby a sheath of matrix fluid is hardened around a streaming fluid. For example, the output channel need not be circular in cross-section, and can take on other shapes such as elliptical, square, rectangular, hexagonal, and other shapes. Furthermore, although the example implementations provided herein produce tubular structures in which a solid shell is formed around a single core of streaming fluid, it is to be understood that the microfluidic device configuration may be modified to produce tubular structures with multiple cores of streaming fluid. It is further noted that in such an embodiment, during the extrusion process, the density of the inner and outer streaming and matrix solutions should be approximately equal. Furthermore, the densities of these liquids may be selected to be denser than the solution into which the tubular structures are extruded. This ensures that after formation the tubular structures are not neutrally buoyant or buoyant, which would interfere with the extrusion process.

As noted above, the tubular structures may be formed via the solidification of a complex fluid as it emerges (e.g. is extruded) from the common central outlet of the microfluidic device. In order to finely control the geometry and microstructure of the final solid tubular structure or fiber after formation, a fast solidification (e.g. gelation, hardening, and/or polymerization) process may be employed. Many materials can undergo a sol-gel transition from a colloidal precursor solution to a gel network through controlled polymerization or cross-linking. This transition from colloidal solution to solid can be irreversible or specifically reversible, initiated by a number of means, including photopolymerization, temperature, pH, electric or magnetic field, and ionic concentration gradients[82-84]. Sol-gel inorganic and organic composites and synthetic polymers are widely used to immobilize a wide range of biological materials and in the formation of biosensors[85,86], as are hydrogels like agarose, collagen, and gelatin[84].

Ionically cross-linking sol-gel materials, such as alginate, are suitable candidates for continuous extrusion of tubular structures and fibres because of their rapid ion exchange kinetics leading to quick, controlled gelation[87]. The structure of alginate is a family of co-polymers with varying proportions of two constituent monomers; $\alpha$-L guluronic acid (G) and $\beta$-D-mannuronic acid (M)[88]. Alginate gelation relies on the selective ionic affinity of alginates to calcium ions ($Ca^{2+}$), and its ability to cooperatively bind these ions. During ionic exchange this binding occurs strictly between the G residues and $Ca^{2+}$ ions, where the total $Ca^{2+}$ content and alginate concentration are the main factors affecting gelation rate[89], as well as the frequency and distribution of the G residues in the bulk material[90].

As noted above, one example process for solidifying the matrix solution is a cross-linking process. For example, in some embodiments, the streaming liquid and/or the liquid into which the tubular structure emerges (e.g. the liquid within the reservoir), may contain a cross-linking species (such as an ionic species), and the matrix solution may include monomers or polymers that are cross-linked in the presence of the cross-linking species, such that cross-linking of the matrix fluid is initiated at or near the output of microfluidic device where the matrix liquid contacts the streaming liquid. Accordingly, the solidification of polymer solution or fluid streams forms a tubular structure, optionally with spatial heterogeneity that is determined by the controlled dispensing of the one or more different matrix fluids.

Alginate is a suitable representative of ionically cross-linked materials because it does not require any external stimuli (i.e. temperature change or pH change) to initiate cross-linking, which would require additional components and limit the scalability and applications of the tubular structure and fiber formation process. It is commonly used as an immobilization matrix for cells[91-94], in tissue engineering[95-97], and in drug delivery.[82,98]

In one embodiment, the microchannels on the two layers feeding the focusing fluid may each be independent of each other ensuring that while uncrosslinked alginate flows inside the device, cross-linking does not occur before the final geometry is established in-flow. For example, devices have been fabricated with independent microchannel arrays having thicknesses of 190 μm.

In some embodiments, the inner and outer streaming inlets are independent of each other, allowing for dynamic control of the wall thickness and tubular structure diameter (e.g. inner or outer diameter). The inner and outer streaming layers, if perfused at the same flow rate, are expected to have the same flow resistance. In the case of the example devices fabricated by the inventors, for streaming flow rates of up to 2 ml/min, the pressure drop was no more than 1 psi.

The tubular structures may be continuously extruded into a reservoir containing the streaming solution, to ensure complete cross-linking. During extrusion, the tubular structure may either be unsupported at its end or it may be actively pulled at a constant velocity, $U_{Pull}$.

As noted above, in some embodiments, the extrusion of the tubular structure into the free reservoir employs two focusing streams, inner and outer streaming fluids, to define the shape of the tubular structures. In one example embodiments, the tubular structure may be directly extruded into a reservoir, while in another example embodiment, the tubular structure may pass through a confinement conduit that is co-axially aligned with (and optionally attached to) the common central outlet on the bottom of the microfluidic device for flow confinement. For example, as shown in FIG. 1A, a confinement cylinder may be provided to confine and control the flow of the extruded tubular structure. The outer streaming fluid occupying the annulus between the guiding cylinder exert a fluid shear stress that promotes the formation of tubular structures with consistent properties, and has an effect on the mechanical properties of the produced tubular structures.

FIGS. 2A-F show various example design of microfluidic devices configured for making different tubular structures in terms of geometry, composition and throughput. Inlets are labeled as follows: streaming fluid inlet (1), matrix solution 1 inlet (2), matrix solution 2 inlet (3), vacuum inlet (4), perfusion fluid inlet (5). The device in FIG. 2A may be employed, for example, for the formation of the tubular structures shown in FIGS. 3C, 3D, 3E, 4C 5B and 5C. The device in FIG. 2B may be employed, for example, for the formation of the tubular structures shown in FIGS. 4C, 4D, 4E, 4F, 4G and 4N. The device in FIG. 2C may be employed, for example, to implement the fixation embodiments shown in FIGS. 6H, 6I, 6J and 6K (as described in more detail below). The device in FIG. 2D may be employed, for example, for the formation of the tubular structures shown in FIG. 4M. The device in FIG. 2E may be employed, for example, for the formation of the tubular structures shown in FIGS. 4A 4B and 5A.

It will be understood that the aforementioned embodiments may be adapted to enable to controlled formation of multiple tubular structures from a single microfluidic device. An example of such a multi-reactor device is shown in FIG. 2F, shows the design of an example extrusion device for the extrusion of 10 single layer homogeneous, tubular structures. The device consists of 3 layers from top down, including inner streaming layer (FIG. 2F(i)), matrix layer (FIG. 2F(ii)) and outer streaming layer (FIG. 2F(iii)). The device in FIG. 2F can provide a higher throughput of tubular structure production by extruding 10 tubular structures simultaneously.

It is also noted that although the many of the embodiments described herein employ the use of both inner and outer streaming fluids to support and/or guide the formation of the sheath of matrix liquid that is extruded from the common central outlet, in some alternative embodiments, tubular structures may be formed without the presence of the outer streaming fluid. For example, any of the devices shown in the examples provided herein may be operated without providing outer streaming fluid, or, may be modified such that the outer streaming fluid microfluidic layer is not present in the device.

In some embodiments, an automated collection mechanism may be employed to collect the extruded tubular structures. In one example embodiment, the collection mechanism may include a rotating collection rod, which may collect the continuous extrusion of the tubular structures to generate layered and perfusable soft materials. In some embodiments, tubular structures can be continuously extruded with dynamically changing, spatially dependent properties to create a bulk soft material with predictable and heterogeneous properties. Porosity of the bulk tissue can be controlled by altering the tubular structure diameters, translation speed, and matrix composition.

The following sections describe three example implementations of microfluidic device configurations for producing tubular structures of various composition and heterogeneity.

Single Layer Matrix with Localized Heterogeneities and Independent Inner and Outer Streaming The example device shown in FIG. 2B illustrates another example embodiment for the extrusion of a continuous tubular structure with localized heterogeneities. The example device of FIG. 2B is suitable for forming tubular structures with 3 circumferential spots, where the device consists of 4 layers from top down, formed from layers including matrix solution feeding layer (FIG. 2B(ii)), inner streaming layer (FIG. 2A(i)), additional matrix layer with 3 spotting channels (FIG. 2B(i)) and outer streaming layer (FIG. 2A(iii)). The heterogeneities may be formed via selective spotting of a secondary matrix material during extrusion. This related experimental setup allows the extrusion at a constant matrix flow rate and individual transiently pressurized on-chip wells containing a secondary matrix material.

Single Layer Matrix with Variable Composition and Independent Inner and Outer Streaming In another example embodiment, a microfluidic device is provided that allows a continuous tubular structure with a varying composition along the tubular structure circumference to be produced. For example, the device design shown in FIG. 2D forms a tubular structure with one half its circumference composed of matrix A and the other half composed of matrix B, with two independent matrix inlets on each side. The example extrusion device shown in FIG. 2D may be employed for forming a heterogeneous tubular structure with different compositions on each half of the tubular structure, consisting of 3 layers from top down, including inner streaming layer (FIG. 2A(i)), half-half matrix layer with 2 inlets for each half (FIG. 2D(i)) and outer streaming layer (FIG. 2A(iii)). Although example implementation shown in FIG. 2D illustrates a microfluidic device configured for two matrix materials, in will be understood that this design can be modified to include more than two sections, being composed of either two or more matrix materials.

In other example embodiments, this design can also be extended to allow the matrix composition to vary with time. For example, in one embodiment, the matrix fluids may be provided such that one half of the cross-section is initially composed of matrix A, and later of matrix B, while the second half is initially composed of matrix B, and later of matrix A.

Triple Layer Matrix with Independent Inner and Outer Streaming

The microfluidic devices outlined above were designed to extrude single-walled tubular structures with a homogeneous composition. However, since the design is modular, it is possible to incorporate multiple matrix layers and therefore create multi-walled tubular structures by stacking more matrix layers in between the inner and outer streaming. FIG. 2E shows an example microfluidic device configuration with two streaming layers and 3 matrix layer. The configuration can be extended include additional matrix layers. The device shown in FIG. 2E may be employed for the extrusion of tubular structures having three coaxial layers, the device consisting of 3 layers from top down, including inner streaming layer (FIG. 2A(i)), matrix layer 1 (FIG. 2A(ii)), matrix layer 2 (FIG. 2E(i)), matrix layer 3 (FIG. 2E(ii)) and outer streaming layer (FIG. 2A(iii)).

Figure 3A:
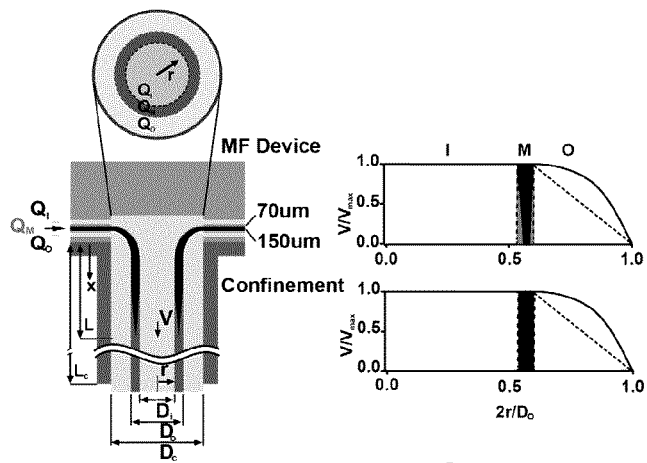
FIGS. 3A-G show characterization of homogeneous tubular structures.

The effect of confinement at the device outlet during extrusion was investigated by building a manifold (guiding cylinder) to create a uniform confinement around the extrusion outlet. As shown in FIG. 3A, the confinement was provided by a 25.4 mm long cylinder with an inner diameter of 3.2 mm that was concentrically mounted to the device outlet hole through which the tubular structure is being extruded. The inner streaming serves the purpose of a template that keeps the tubular structure from collapsing. The velocity profile shown in FIG. 3A states that there is no velocity gradient along the radius from the center of the cylindrical flow to the outer wall of the biopolymer solution flow. The flow profile from the outer wall of the biopolymer solution flow sheath to the inner wall of the confinement is parabolic. At the inner wall of the confinement, the velocity of the fluid is 0. This generate stress on the outer wall of the biopolymer solution flow sheath which later become the outer wall of the tubular structure. The development of this analytical model is discussed in the example section.

Figure 3B:
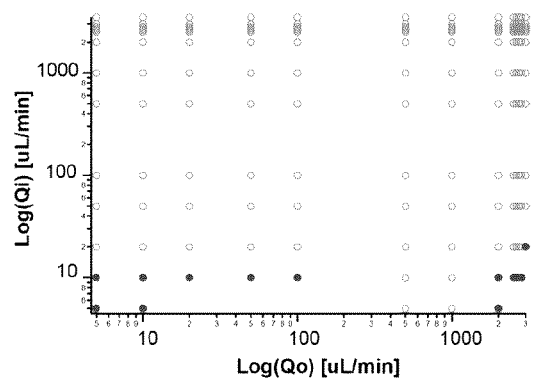

Provided that extrusion into a reservoir at the output of the microfluidic device is performed at a flow rate that is a below threshold value, extrusion occurs with minimal flow instabilities and break-up of the tubular structure is not observed at the device outlet. Above the threshold flow rate, stable flow and tubular structure formation cannot be achieved. Without intending to be limited by theory, it is believed that this may be due to flow instability, and/or the rapid dispersion and mixing at the outlet. In the example implementation in which alginate is employed, instabilities are not observed for extrusion flow rates in the range of $Q_m=10$ µl/min to $Q_m=400$ µl/min, inner streaming flow rate $Q_i=5$ µl/min to $Q_i=4.5$ ml/min and outer streaming flow rate of $Q_o=0$ µl/min to $Q_o=4.5$ ml/min. Outer streaming is not essential for tubular structure formation such that tubular structures are still produced while outer streaming is stopped completely. FIG. 3B shows an extensive investigation of the operation envelop that tubular structures are formed. Some parameters are kept constant such as matrix flow rate $Q_M=200$ µl/min, matrix density $\rho_m=1.12$ kg/m$^3$, outer streaming density $\rho_{os}=1.12$ kg/m$^3$, and reservoir solution density $\rho_r=1.08$ kg/m$^3$.

Figure 3C:
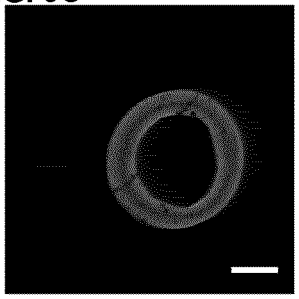
Figure 3D:
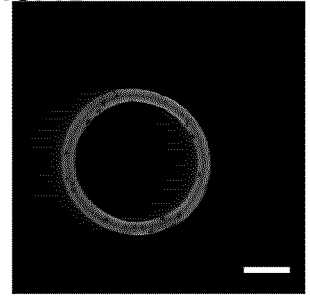
Figure 3E:
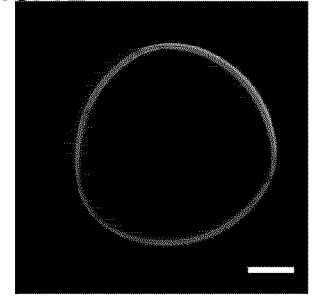
Figure 3F:
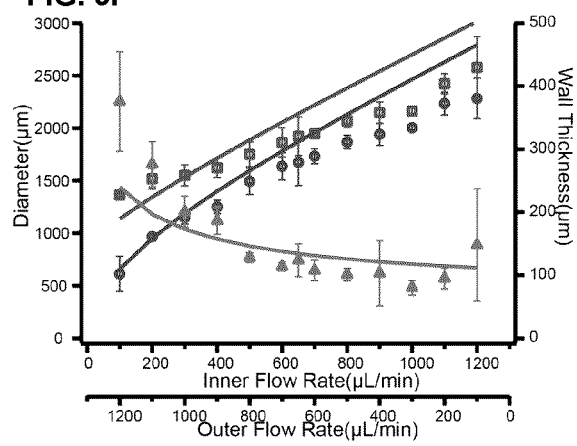
Figure 3G:
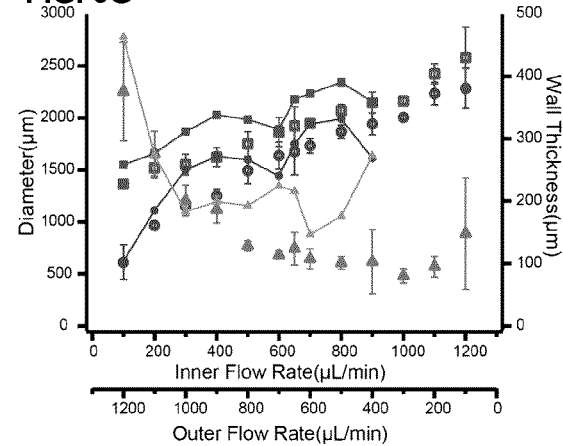

As described in various example embodiments of the present disclosure, the geometry of the tubular structures may be dynamically controlled, for example, by varying the relative flow rates of the matrix and/or streaming layers and the relative orientation of the layers to each other in the device. FIGS. 3C, 3D and 3E show different sizes of tubular structure that are formed by controlling the inner and outer streaming flow rate while keeping the matrix flow rate constant. The tubular structure geometry produced by various flow rates agrees well with predictions made by the analytical model (FIG. 3F). The details of controlling tubular structure dimensions are discussed in examples. To prove that inner streaming is acting as a template as described in the analytical model, tubular structure extrusion are performed with different flow rates of inner and outer streaming fluids with inner streaming fluid that does not carry cross-linker. It is observed that this change introduced extra instabilities to the extrusion process that tubular structures are not formed in high flow rates. However, the geometry of the tubular structures formed are comparable to the condition that crosslinker is carried in the inner streaming at same flow rates (FIG. 3G).

Figure 4A:
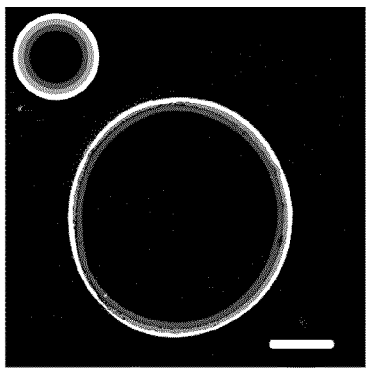
FIGS. 4A-N show examples of different heterogeneous tubular structures produced according to various methods described herein.
Figure 4B:
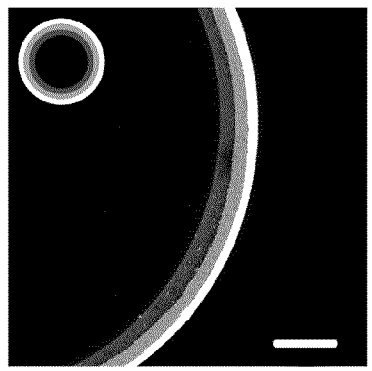
FIG. 4B shows a confocal image of cross section of tri-layer alginate tubular structure wall formed at $Q_I$=1200 µL/min, $Q_m^1$=67 L/min, $Q_m^2$=67 µL/min, $Q_m^3$=67 µL/min and $Q_o$=100 µL/min. (Scale bar 200 µm)
Figure 4C:
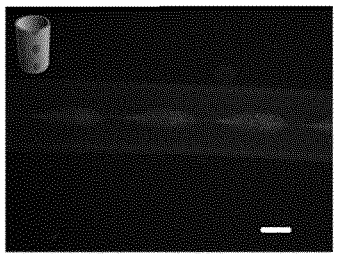
FIG. 4C shows a fluorescence image of large spots produced by subjecting the spotting inlet channel to a pressure of 1 Psi during a solenoid valve opening time of 100 ms. (Scale bar 500 µm)
Figure 4D:
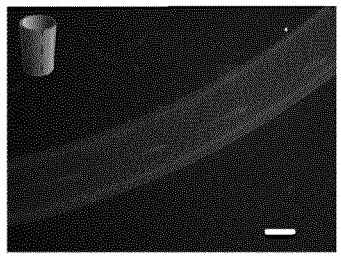
FIG. 4D shows a fluorescence image of small spots produced by 200 ms opening time of spotting channel with 0.6 Psi. (Scale bar 500 µm)
Figure 4E:
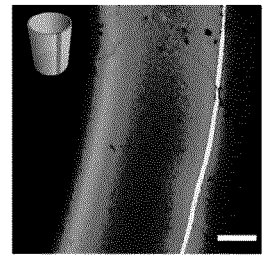
FIG. 4E shows a confocal image of side view of the second biopolymer stripe on tubular structure wall. $Q_I$=650
Figure 4F:
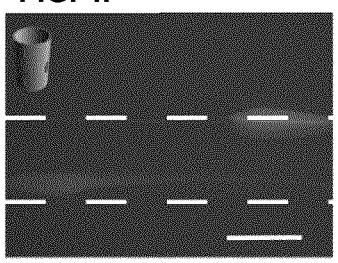
FIG. 4F shows a fluorescence image of alternating spots produced by 100 ms opening time of spotting channel with 1 Psi. (Scale bar 1 mm)
Figure 4G:
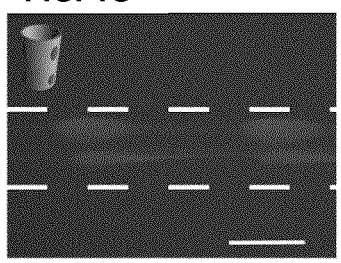
FIG. 4G shows a fluorescence image of 2 rows of parallel spots produced by 100 ms opening time of spotting channel with 1 Psi. (Scale bar 1 mm)
Figure 4H:
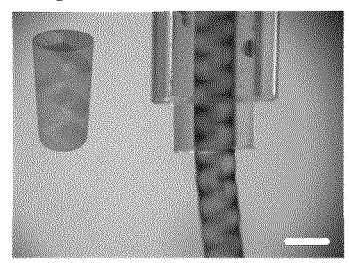
FIG. 4H shows a corkscrew shaped inner wall tubular structure. $Q_I$=3500 µL/min, $Q_m$=200 µL/min and $Q_o$=5 µL/min. (Scale bar 3 mm)
Figure 4I:
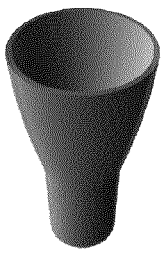
FIG. 4I shows schematics of an example tubular structure with a diameter that varies along the axial direction.
Figure 4J:
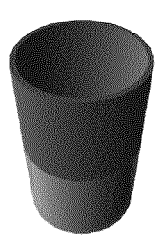
FIG. 4J shows a schematic of an example tubular structure with a composition that varies along the axial direction.
Figure 4K:
FIG. 4K shows a schematic of an example bilayer tubular structure with a different composition in each layer.
Figure 4L:
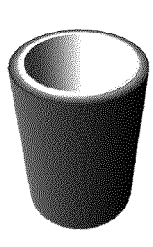
FIG. 4L shows an schematic of an example multi-layer tubular structure with a gradient in composition along the thickness of the tubular structure wall. The number of layers can be controlled by adjusting the number of matrix layers in the device. This drawing shows 5 layers in the tubular structure.
Figure 4M:
FIG. 4M shows a schematic of an example tubular structure with two halves of the tubular structure wall made of different composition.
Figure 4N:

In addition to continuously extruding single-walled tubular structures with controlled diameter and wall thickness, illustrative embodiments of the present disclosure also provide methods for forming tubular structures having complex geometries and/or controlled heterogeneities, such as those illustrated in FIG. 4A-N. In some embodiments employing similar devices and methods to those utilizing a single matrix material, the in-flow creation of n-layered tubular structures may also be achieved with up to n-compatible biopolymer materials, as shown in FIGS. 4A, 4B, 4K and 4L.

Similarly, as described further below, tubular structures having two or more compatible materials across the tubular structure cross-section may be formed. For example, one or more matrix microfluidic channels may be configured to deliver different matrix solutions than other microfluidic channels. Such an embodiment may be employed to form vertical tessellations in the tubular structure properties, which may be employed to affect and/or control the mechanical properties of the tubular structures. These and other embodiments are described in further detail below with reference to FIGS. 2B, 2D and 2E. In some example embodiments, spots and stripes having different composition than the main body of the tubular structure may be introduced in order to form a tubular structure with controlled heterogeneity. Using different pressures at the inlet of spotting channels lead to different spot sizes (for example, as shown in FIGS. 4C and 4D). In another example implement involving one or more microfluidic channels having a different matrix composition, the one or more of the microfluidic channels may be controlled such that it remains continuously open, thereby producing a stripe on the tubular structure (FIG. 4E). The spotting channels can be separately controlled and function simultaneously (FIGS. 4F and 4G).

In the examples shown in FIGS. 4C, 4D, 4E, 4F and 4G, both the spots/stripes and the main tubular structure body are made of alginate, but are dyed with different fluorescence constituents. However, it will be understood that the spots, stripes and/or the tubular structure need not be formed by alginate, or via a common material. The different components of a tubular structure may be formed from different matrix materials, optionally having one or more payloads, as described below. In one example implementation, multiple types of biopolymers can be introduced in the spots or stripes at the same time since each spotting channel is stand along in terms of biopolymer source and flow control.

It will also be understood that the geometry of the inner surface of the tubular structure may be varied and controlled by controlling the time-dependent flow rates of the fluids. For example, in one example implementation, a corkscrew shaped inner wall (FIG. 4H) can be produced, for example, by ramping up $Q_i$ to above 2.5 mL/min and lower $Q_o$ to below 100 µL/min using a syringe pump. This tubular structure is produced by device in shown in FIG. 2A. Details of various example heterogeneous tubular structures are discussed in example section provided below.

In example embodiment involving two or more matrix layers for forming multiple matrix layers, internal coaxial tubes may be formed in the walls of a tubular structure. For example, using the device shown in FIG. 2E, with the mid matrix channel feeding template solution which does not harden to a selected number of microfluidic channels within the intermediate layer (e.g. the solution does not crosslink or contain crosslinkers), a tubular structure with circumferential array of adjacent internal tubular structures (FIG. 5A) can be extruded.

Figure 5A:
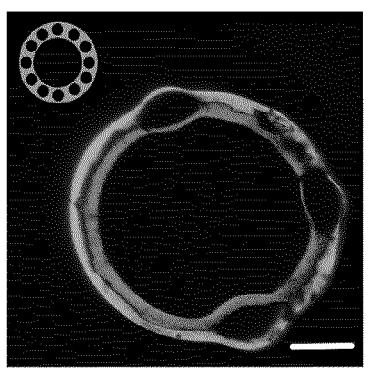
FIGS. 5A-O show additional example configurations of extruded tubular structures, alternate extrusion profiles and extruded assemblies.
Figure 5B:
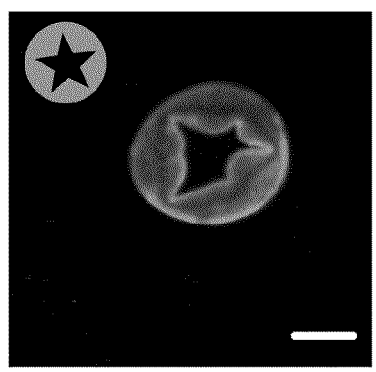
FIG. 5B shows a confocal image of cross section of an example tubular structure having a star-shaped inner wall, formed with the following conditions: $Q_I$=100 µL/min, $Q_m$=200 µL/min and $Q_o$=1200 µL/min. (Scale bar 500 µm)
Figure 5C:
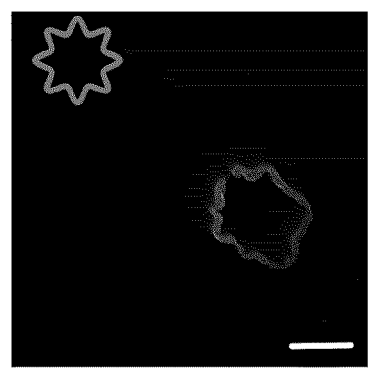
FIG. 5C shows a confocal image of the cross section of an example tubular structured with crimped walls, formed with the following conditions: $Q_I$=23 µL/min, $Q_m$=10 µL/min and $Q_o$=277 µL/min. Confinement size $D_c$=1.59 mm (Scale bar 500 µm)

It is also noted that by lowing the ratio of $Q_i$ and $Q_o$, it is possible to form a tubular structure with a star shape inner wall (FIG. 5B). The method of extrusion is the same as extrusion of regular tubular structures. The flow rates are controlled by syringe pumps. Due to the structure of the device at the exit, the fluids in the top two layers (inner streaming and matrix) will meeting first and then meet with the fluid come in from the bottom layer (outer streaming layer). While the inner wall of the tubular structure formed earlier than the outer wall, its circumference is defined prior entering the confinement region. A low flow rate in the inner streaming leads to a low inner diameter and forces the inner wall to fold. The outer wall forms later so that its circumference is defined after the outer diameter is defined in the confinement. This tubular structure is produced by device in FIG. 2A. Tubular structures with crimpled wall (FIG. 5C) can be produce by using calibrated flow rates and a smaller confinement channel at the exit of device in FIG. 2A. While the cylindrical flow containing the semi crosslinked tube is forced through a narrower tubular path, the flow has to adapt the channel change by shrinking its diameter and increasing its velocity. As the flow has diameter shrank, the semi crosslinked tube is also compressed towards the center and force the tube wall to fold. Crosslinking completes after the shrinkage of diameter. Therefore the tube wall keeps the folded shape.

Using the methods present in this disclosure, additional configurations of extruded tubular structures, alternate extrusion profiles and extruded assemblies can be extruded such as contiguous tubular structure assembly with non-uniform boundary, contiguous tubular structure assembly with rectangular boundary, tubular structure assembly with adjustable inter-tubular structure spacing and crimpled sheet. (FIGS. 5D-F).

Figure 5D:
FIG. 5D shows a schematic of an example continuously extruded contiguous tubular structure assembly with a non-uniform boundary.
Figure 5E:
FIG. 5E shows a schematic of an example continuously extruded contiguous tubular structure assembly with a rectangular boundary.
Figure 5F:
FIG. 5F shows a schematic of an example continuously extruded tubular structure assembly with variable inter-tubular structure spacing. The inter tubular structure spacing is shown constant in the drawing but can be tuned by changing device design.
Figure 5G:
FIG. 5G shows a schematic of an example continuously extruded crimped sheet.
Figure 5H:
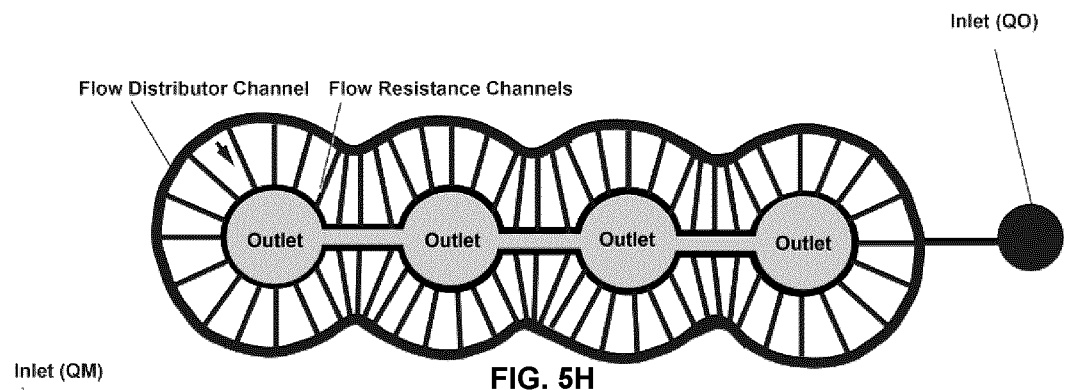
Figure 5I:
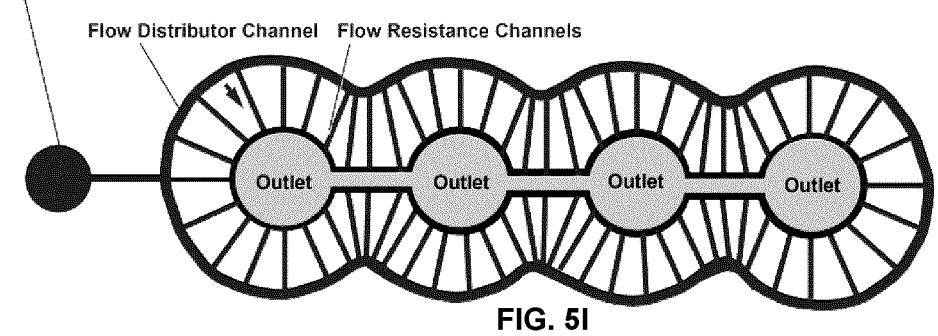
Figure 5J:
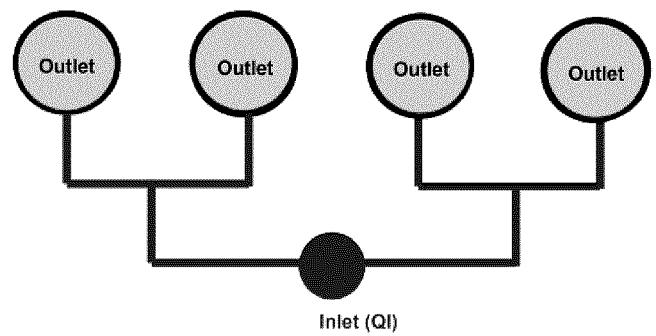

For example, the tubular structure shown in FIG. 5D may be formed, for example, using the microfluidic device consisting of 3 feature layers that are schematically shown in FIGS. 5H-J. The inner fluid is distributed on the top layer (shown at the bottom of the figure panel) that is sealed by bonding to a flat substrate containing holes that allows the inner, matrix and outer fluids to be feed through. Note that black features represent microchannels, i.e., regions only partially penetrating feature layers. Grey features represent void regions penetrating the entire feature layer. The matrix fluid is distributed to the next following layer using a flow distributor channel that is characterized by a large cross section and low flow resistance. Narrower flow resistance channels distribute the matrix fluid homogeneously from the flow distributor channel towards the outflow feature at the device center. The bottom feature layer (shown at the top of the figure panel) closes the device and possesses a microchannel configuration similar to the matrix layer. It distributes the outer fluid uniformly. The device geometry allows a vascularized sheet to be extruded in the downward direction.

Figure 5K:
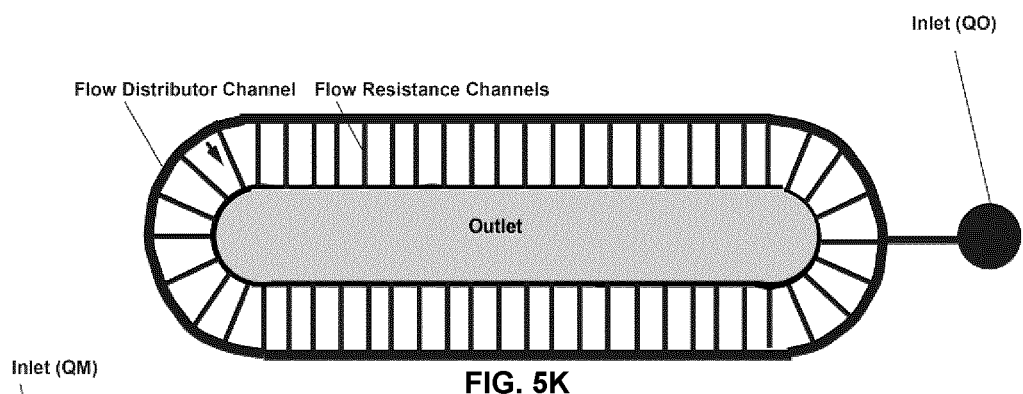
Figure 5L:
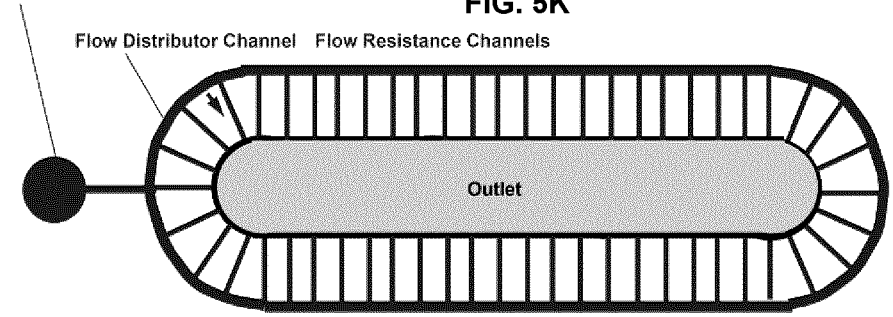
Figure 5M:
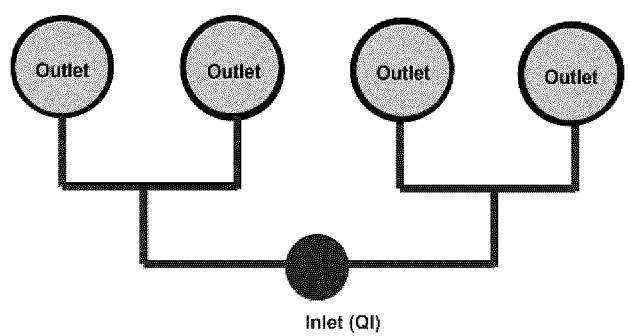

The tubular structure shown in FIG. 5E may be formed, for example, in a related fashion by using the feature layers schematically shown in FIGS. 5K-M, where the matrix and outer fluid layers have been slightly modified.

The tubular structure shown in FIG. 5F may be formed in a device geometry that is very similar to the one employed to produce the structure shown in FIG. 5D, for example, using the device shown in FIGS. 5H-J.

Figure 5N:
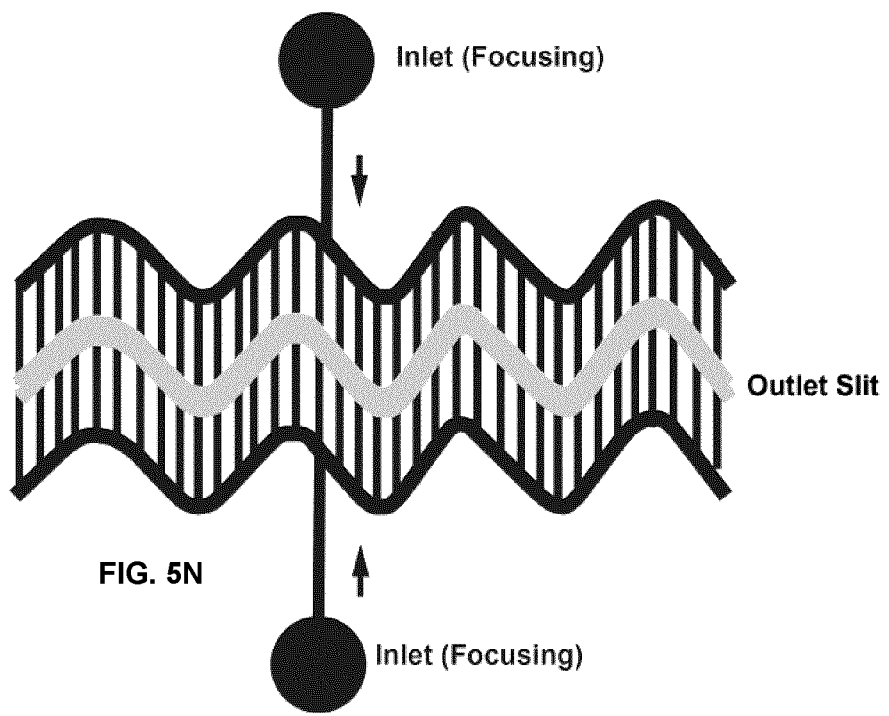
Figure 5O:
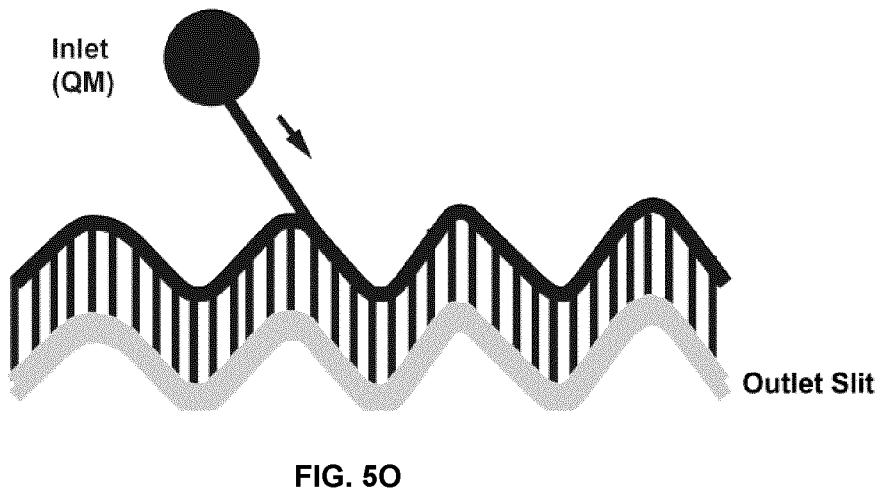

The structure shown in FIG. 5G may be formed, for example, using a device consisting of two feature layers that is shown in FIGS. 5N and 5O. The top layer (shown at the bottom) carries the matrix is capped by a flat substrate. Below, the feature layer carrying the (outer) focusing fluid is bonded and closes the device architecture. The device allows a corrugated soft material sheet to be extruded in the downward direction.

Although many the preceding example embodiments, and many of the embodiments and examples below, refer to the formation of tubular structures from the controlled microfluidic dispensing of biopolymer solutions, it is to be understood that the scope of the present disclosure is not intended to be limited to materials formed from biopolymers. In other embodiments, solidifying process may be a polymerization process, crystallization process, gelation process, emulsification process, or other hardening process such that the complex liquid that emerges from microfluidic device is transformed into a tubular material that is solid, physically resilient or in a substantially non-flowing state. It is to be understood that the term "solid", as used herein, includes soft materials such as hydrogels. The wall thickness of the tubular material emerging from the device may be controlled, for example, by varying the flow rate of the matrix and streaming fluids and the extrusion speed.

Other suitable solidification methods include other forms of polymerization, including physical and chemical crosslinking. In some embodiments, the polymerization may be achieved by photopolymerization. In other embodiments, the polymerization may be achieved via free radical polymerization. For example, solidification may be achieved using a polymer such as polyethylene glycol diacrylate (PEGDA) with a commercially available photoinitiator Irgacure® 2595, or methacrylic alginate that is able to polymerize with both an ionic and a photo crosslinking reaction. Additionally or alternatively, thermally induced polymerization may be employed as a solidification method. For example, a solidified material may be obtained by thermally induced gelation of Matrigel and collagen, and mixtures of these with synthetic or natural hydrogels. Example hardening materials that may be employed include polymers such as PLGA, PLA, and mixtures thereof, and hydrogels including interpenetrating polymer networks (IPNs) and other types of gelation (for example, shear-induced gelation of micelles).

It is to be understood that the polymer solution need not contain biopolymeric monomers, precursors, or other biomolecular species that form biopolymers. In some embodiments, polymerization may be performed such that the tubular structure is formed from a polymeric material other than a biopolymer.

The microfluidic devices, tubular structures, and methods of their fabrication described above may be used and/or adapted for a wide variety of applications, including tissue replacement materials (grafts), synthetic tissue models, and engineered tissue constructs for in-vitro applications such as drug development and high throughput/high content screening.

In one example implementation, vascular grafts may be formed from single-or multi walled tubular structures that may or may not be populated with cells. For example, the following cells may be used as payload: endothelial cells, smooth muscle cells, fibroblasts, as well as undifferentiated cells (e.g., induced pluripotent cells or stem cells). Diffusible or binding molecules factors or proteins may be incorporated into the soft material tubular structures, optionally with spatial control, for example, to promote cell attachment, alignment, and differentiation. Cell-populated tubular structures may be applied as vascular grafts in vivo right after formation or after perfusion culture.

In another example implementation, a synthetic trachea may be formed by incorporating epithelial cells, tracheal smooth muscle cells, fibroblasts, as well as undifferentiated cells (e.g., induced pluripotent cells or stem cells). Diffusible or binding molecules factors or proteins may be incorporated into the soft material tubular structures with spatial control, e.g., to promote cell attachment, alignment, differentiation. Cell-populated tubular structures may be applied right after formation or after perfusion culture. Additional structures that may be formed include artificial intestines, artificial bladder, and stents.

It is noted that in addition to using ion exchange for cross linking, one may extrude single or multilayered tubular structures and tubular structures of elastomers, UV curable polymers, block-copolymers and thermoplastics (PEEK, Teflon/PTFE). These tubular structures could be extruded in the described silicon/glass based devices that are compliant with the relevant extrusion conditions (i.e., temperatures, pressures).

In other embodiments, single-layered polymeric tubular structures may be extruded where monomers are co-extruded in an alternating fashion along the tubular structure circumference. Monomers inter-diffuse to initiate polymerization.

The extruded tubular structures may single- and multi-layered tubular structures with controllably embedded payloads. Examples of payload include of fluorescent molecules, one or more assay reagents (e.g. ligands and/or reporter molecules), chromophores, nanoparticles (e.g. semiconductor or metallic nanoparticles), microparticles, microgels, and/or one or more medicaments or drug delivery vehicles. Payloads may additionally or alternatively include biological molecules and cells such as antibodies, DNA, RNA, biological molecules, proteins, growth factors, cytokines, viruses, bacteria, algae, and other biological cells. Examples of biological cells include mammalian cells (e.g. cardiomyocytes, epithelial cells, tracheal smooth muscle cells and fibroblasts), fungi, viruses, phytoplankton, algae, microorganisms, bacteria, luminescent bacteria. The base and secondary materials may serve as a template, e.g., for gelation, sintering. The template will define the shape and the living space for the cells, also provide mechanical support and nutrition for the structure. Cells will later consume and replace the space occupied by the template.

In other embodiments, single or multilayered tubular structures may be extruded with a biopolymer or UV curable polymer matrix as a template material that contains a payload of ceramic or metallic particles. Upon extrusion, the tubular structures may be sintered removing the (polymeric) template and leaving a sintered ceramic or metal tubular structure.

In some embodiments, the incorporation of cellular payloads may be employed for the controlled formation of tubular microtissues composed of multiple cell types. Non-limiting examples of tubular biomimetic structures that may be formed according to the methods provided herein (e.g. for tissue engineering and regenerative medicine), include blood vessels, airways (e.g., bronchi, bronchioles, alveoli), liver lobule, primitive (tubular) or developing heart. The type and function of the tubular tissue/organ formed will be depending on the type of cells embedded in the tubular structure during extrusion process.

In some embodiments, the co-extrusion of multilayer tubular structures, employing the selection of different matrix materials or payloads, may render (sections of) the layers either electrically conducting (e.g., by incorporating carbon nanotubular structures or nanowires), electrically insulating or semiconducting (e.g., by incorporating semi-conducting nanoparticles, e.g., CdSe, CdTe, CdS or Si quantum dots).

The combinations of these different payloads may provide tubular structures with device-level functional properties. Examples may include (colloidal) light emitting diodes, (colloidal) solar cells, batteries or flow through fuel cells.

In some embodiments, extruded tubular structures may provide formats for the 3D culture of incorporated mammalian or plant cells in tubular matrix for cell culture, cell expansion or for genetic engineering. Extruded tubular structures may provide a 3D culture format encompassing module of tubular photobioreactor where algae are embedded in a hydrogel wall that is internally perfused and externally subjected to (sun) light. The tubular structures may be placed behind a glass window or tubular structure and subjected to either diffuse or direct sunlight or to artificial lighting.

Extruded tubular structures may provide a 3D format for co-culturing scalable quantities of cells. Cells can be controllably co-localized along the circumference of the tubular structure or in different layers of multilayered tubular structures, or both.

Extruded tubular structures may be formed either in the absence of streaming liquid if the tubular structure extrusion is confined by an outer cylinder. In select cases, the inner or outer focusing fluids, or both focusing fluids may be gasses. In the latter case tubular structure formation may be combined with a drying process.

Hosting, Fixation, and Perfusion of Tubular Structures

The ability to controllably perfuse and establish a transmural pressure gradient of tubular structure segments is crucial to determine comparable mechanical properties of tubular structures. The traditional approach is cannulation, as in a standard pressure myography system[5], where tubular structure segments are cannulated on micro-pipettes and perfused. This technology is well-established but highly manual and requires a significant skill level to cannulate and pressurize predictably, especially as tubular structure or vessel diameter decreases. This issue was addressed for resistance arteries previously in a microfluidic context[6], and an alternative technique was developed to reversibly fix artery segments in an inspection area by applying sub-atmospheric pressure to hold the ends of the segment open for perfusion. This concept could be translated to larger-diameter tubular structure segments to achieve the same pressurization and perfusion control, as shown in FIGS. 7A-7C.

Tubular structure segments can be hosted on chip with control of the luminal and abluminal microenvironment, as shown in FIG. 7A. Devices were designed to inspection area depths ranging from 0.75 mm to 1.5 mm and milled in COC, then bonded at high temperature and pressure using a hot embossing machine.

Using this device and previously developed fixation methods, mechanical properties of extruded tubular structures, such as compliance and circumferential elasticity, can be probed (see FIG. 7B).

In some embodiments, hosting and perfusing of tubular structures may be performed by reversibly sealing a tubular structures within a microfluidic device. An example of such an embodiment is illustrated in FIGS. 6A-D. Such devices that may be employed for the internal fixation and optional perfusion of conduits or tubular structures, which are henceforth referred to as "on-chip" devices. On-chip devices disclosed herein may be fabricated, for example, according to methods described above in the present disclosure, and based on the materials and methods disclosed in US Patent Publication No. US 2011/0287469, which is incorporated herein by reference in its entirety.

Figure 6A:
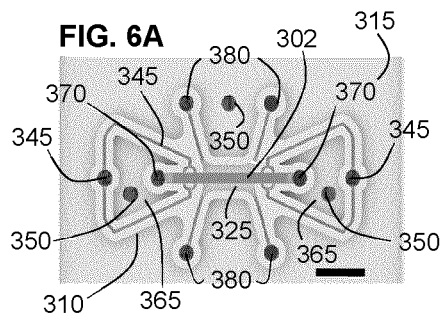
FIGS. 6A-M show on-chip (FIGS. 6A-G) and off-chip (FIG. 6H-M) reversible fixation of tubular structures.
Figure 6B:
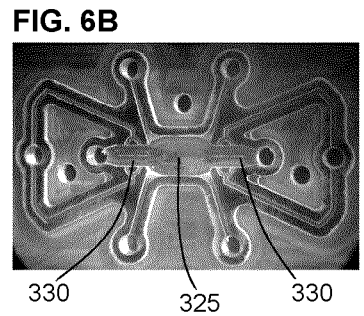
Figure 6C:
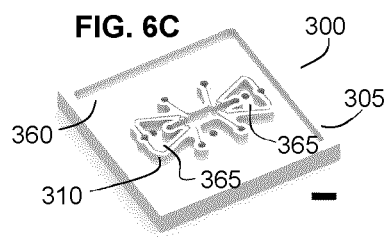

Referring now to FIGS. 6A-C, an example on-chip device is shown that is configured to be reversibly sealed onto a surface by the application of negative pressure or a vacuum to one or more vacuum inlets. FIG. 6A shows a plan view, and FIG. 6C shows an isometric view, of an example reversibly sealable conduit hosting device 300. FIG. 6B shows a photo of a fixation device that was fabricated according to the example embodiment shown in FIGS. 6A and 6C (scale bar 5 mm).

Figure 6D:
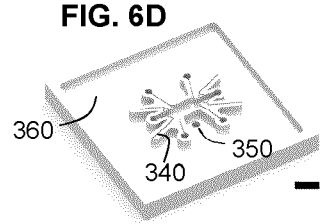
Figure 6E:
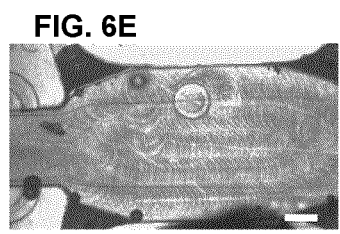
Figure 6F:
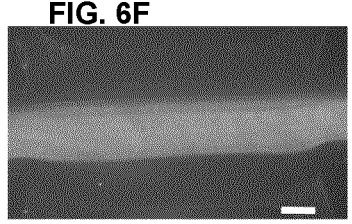
Figure 6G:
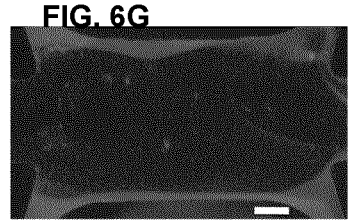
Figure 6H:
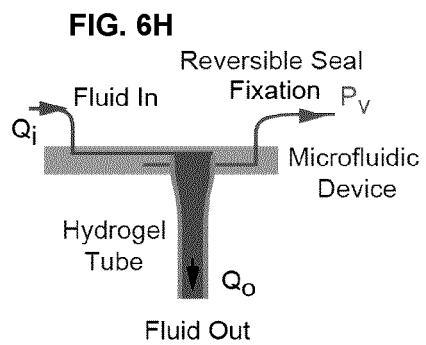
Figure 6I:
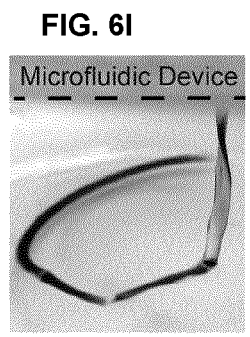

Device 300 includes an external wall portion 305 and an internal wall portion 310, extending from base 315. Internal wall portion 305 encloses a perfusion and fixation chamber defined by an enlarged central superfusion region 325 and lateral fixation regions 330 (as shown in FIG. 6B). Lateral fixation regions 330 are in fluid communication with one or more fixation channels 340 formed within inner wall portion 310, where each fixation channel is in fluid communication with a fixation port 345 (or an outer vacuum port, as shown in FIG. 6D and described below), and where fixation port 345 is externally accessible for the application of a negative pressure difference, such that a conduit 302 residing within the perfusion and fixation chamber is fixated by the force applied to the conduit side walls residing adjacent the inlets of fixation channels 340. In other words, fixation channels 340 of in the device hold both ends of conduit and keep them open by applying negative pressure (e.g. a vacuum) and stretching out the conduit walls. As shown in the figure, in some embodiments, separate fixation ports 340 may be provided on each side of the device, such that one fixation port 340 is in fluid communication with each lateral fixation region 330.

Upon loading of a conduit 302 into device 300, device 300 may be reversibly sealed by contacting the upper surface of inner wall portion 310 and outer wall portion 305 with a t surface (not shown), and the application of a negative pressure to vacuum ports 350 that are externally accessible. The surface may be provided by the surface of a transparent substrate, such as a glass substrate, in order to enable visualization of the conduit during fixation and perfusion. The surface with which the device is contact may be made from a compliant material in order to achieve an improved seal relative to that obtained from a hard flat surface. As can be seen in the example embodiment shown in FIG. 6A, one or more vacuum ports may be provided within an outer chamber 360 residing between inner wall portion 310 and outer wall portion 305, and/or one or more vacuum ports may be provided within one or more inner chambers 365 defined by inner wall portion 310.

Although FIGS. 6A-6E show an example embodiment in which both an outer chamber 360 and inner chambers 365 are provided, it will be understood that other embodiments may employ one or more outer chambers or one or more inner chambers, for reversibly sealing the device to a flat surface. In embodiments involving one internal chambers for the application of a negative pressure difference, the device need not include outer wall portion.

FIG. 6D shows an isometric view of an alternative embodiment in which only an outer chamber is provided for reversibly sealing the device. Moreover, in the example embodiment shown in FIG. 6D, the fixation channels 340 are in communication with outer chamber 360, such that a single external vacuum port 350 may be provided for both conduit fixation and reversible sealing. Accordingly, in some embodiments, the device need only include a single external port for the application of a negative pressure difference.

In other embodiments, one or more vacuum ports may be defined within one or more of the inner 310 and/or outer 305 wall portions, such that the application of negative pressure is applied locally at one or more points where the wall portion contacts the flat surface that is employed to reversibly seal the device.

A conduit 302 supported within device 300 may be internally perfused by flowing a fluid between perfusion ports, where each perfusion port is in flow communication with a fixation region 330, and where each perfusion port is externally accessible.

Similarly, in some embodiments, two or more superfusion ports 380 may be provided, where each superfusion port is in flow communication with superfusion chamber 325. In some embodiments, a pair of superfusion ports 380 may be provided on each side of the device, thereby optionally defining two separate superfusion pathways on each side of a fixated conduit.

Off-Chip Fixation, Perfusion and Pressurization of Tubular Structure Segments

An alternative embodiment for hosting and perfusing tubular structures may be realized by using one or more devices of the extrusion type, for example, as shown in FIG. 2C, in order to achieve fixation in which a portion of a conduit is fixed on-chip, while the remaining portion of the conduit extends off-chip. Such devices are henceforth referred to as "off-chip" fixation devices.

A modified version of the device shown in FIG. 2A may be employed to reversibly fixate and controllably perfuse a pre-extruded hydrogel tubular structure section. For example, in one example embodiment, an example off-chip fixation device may be realized according to the design shown in FIG. 2C. The example off-chip fixation device shown in FIG. 2C may be formed by stacking (bonding) a including perfusion solution feed layer, as shown in FIG. 2C(i), and a vacuum fixation layer, as shown in FIG. 2A(i). The vacuum fixation layer includes a network of microfluidic channels, similar to the embodiments described above for the distribution of matrix or streaming solution, where the flow in the vacuum fixation layer is directed from the periphery to the center. The inlet channel of the vacuum fixation layer splits into an array of microfluidic channels, where each channel is directed inwardly from a peripheral region towards, and distributed around, a common central outlet. A conduit may be positioned such that a portion of the conduit (e.g. a distal portion) is received in the central outlet of the device, and the application of a negative pressure to the inlet channel of the vacuum fixation layer may be employed to circumferentially fix conduit. The perfusion solution feed layer, as shown in the figure, may include a single channel directed towards the central outlet formed in the vacuum fixation layer, such that fluid flow in the perfusion channel is directed into the fixated conduit.

In one example implementation, a two-layer soft lithographically patterned microfluidic device may be made up of a cast crosslinker layer (3-4 mm thick) and a single channel above feeding a perfusable fluid to the tubular structure. The radial organization of microchannel network around the central outlet hole serves as the fixation site of the tubular structure section. A sub-atmospheric pressure, $P_{vac}$, is applied to the inlet of this network causing suction into the channels from the outlet hole. At the critical pressure level, the outer diameter of the elastic tubular structure expands to meet the diameter of the outlet hole, forming a reversible seal. The range of vacuum pressures, $P_{vac}$, for a successful seal and head pressures, $P_{head}$, for which the seal holds and the tubular structure remains intact when the downstream end is pinched, were explored. The top layer of the device allows the fixed biopolymer tubular structure to be controllably perfused with flow rate, Q, with minimal loses to the evacuated channels.

It will be understood that an off-chip fixation device may include more than one vacuum fixation layer. It will also be understood that multiple off-chip fixation devices may be employed to fixate a conduit along the length of the conduit. In some embodiments, a positive pressure may be applied via one or more of the vacuum fixation layers in order to locally apply an inwardly directed force to a fixated conduit, for example, for locally collapsing (partially or completely), or crimping, the diameter of conduit, and/or for locally severing a conduit.

Figure 6J:
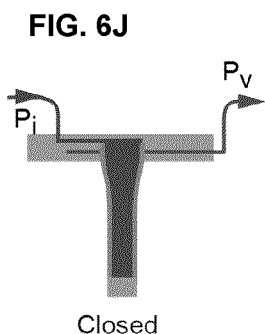
Figure 6K:
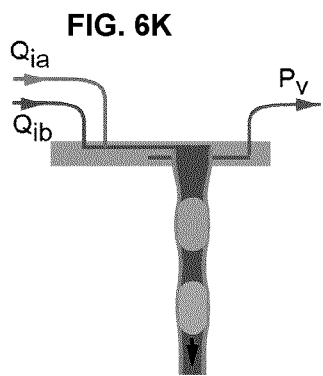
Figure 6L:
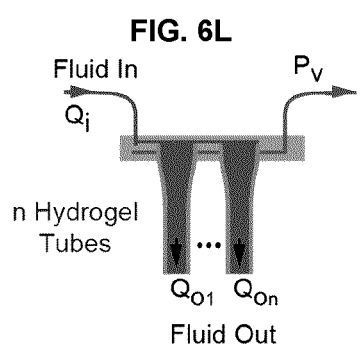
Figure 6M:
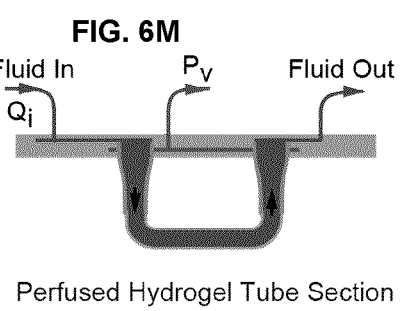

As noted above, the present example off-chip embodiment may be employed to fix a conduit based on a negative gauge pressure applied to the microchannel network of the vacuum fixation layer. As a result, fluid is removed through the microchannels and creates a negative pressure fixation force on the tubular structure to immobilize and perfuse, as shown in FIGS. 6H-K. This method can also be scaled up to support the fixation and perfusion of multiple conduits, as shown in FIGS. 6L-M.

Simple changes to the fixation layer or perfusion layer permits further study of the perfusion of hydrogel tubular structures. FIG. 6J shows segmented flow, formed in the top layer, pumped through a tubular structure. This fixation device can be scaled up simply by adding more fixation units to the device, as illustrated in FIG. 6K, for example, using design FIG. 2F(ii). Flow into this tubular structure travels back into the device and volume loss to the vacuum pressure can be measured. Furthermore, a pattern of many fixation holes can be made in a single layer, all applying sub-atmospheric pressure radially to seal, as shown in FIG. 4I. In such a case, the secured tubular structures may be perfusable, individually or simultaneously, depending on the application.

The reversible seal allows one to controllably or systematically collapse chip-hosted hydrogel tubular structures that are closed on one end, i.e., not perfused. The predictable collapse of a hydrogel tubular structure allows the critical dimension in one of the lateral directions to be significantly reduced, from $D_O$ to $\delta$. Typical values for the reduction are 350-1300%. This reduction may be used as a means of actuation for single tubular structures as well as bulk materials made of tubular assembles. Collapsing tubular structures may be used as a means of controlling tubular structure perfusion.

Tubular Assemblies and Perfusable Bulk Materials

Figure 8A:
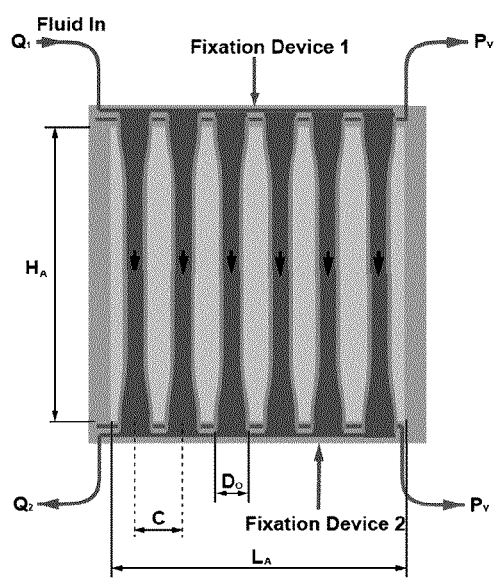
FIGS. 8A-D show tubular structure assemblies of more complex structures.

In some embodiments, off-chip fixation and perfusion devices may be employed for the controlled perfusion of tubular structures which are molded in a scaffold. An example of such an embodiment is shown in FIG. 8A. This may be achieved using two multiple tubular structure fixation devices, for example, as shown in FIG. 6L. For example, two off-chip fixation devices may be employed to fix both ends of one or more tubular structures.

In some embodiments, after having fixated the tubular structures with aforementioned off-chip fixation approaches on both ends a regular array of perfusable tubular structures may be formed. The array can be controllably perfused and may be pressurized to prevent collapse. The interstitial spaces may subsequently be filled with a biopolymer solution that may or may not contain a cellular payload. Upon gelation of the biomaterial upon a chemical stimulus, temperature change or UV exposure a perfusable biomaterial is obtained. Fluids can then be perfused through the tubular structures and diffuse into the scaffold through the tubular structure walls.

Figure 8B:
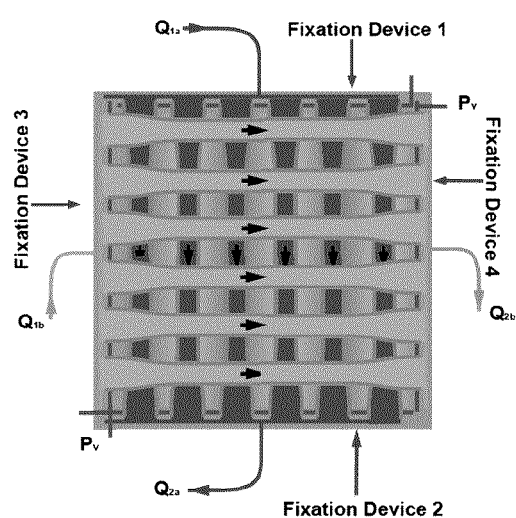

FIG. 8B illustrates an example embodiment in which perpendicular directions perfusion of tubular structures are molded and form a perfusible biomaterial (FIG. 8B) Tubular structures were arranged in a cross-flow configuration using two multiple tubular structure fixation devices (for example, according to the example device embodiment shown in FIG. 6L). In the illustrated example embodiment, two sets of tubular structures are held in perpendicular direction so that fluids can be perfused in perpendicular directions inside the scaffold. The configuration may serve mass transfer operations such as the oxygenation of whole blood.

Figure 8C:
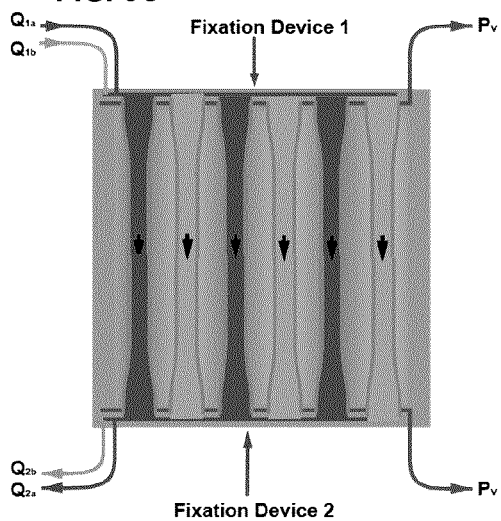

In another example embodiment, illustrated in FIG. 8C, perfusion of alternating tubular structures molded in a scaffold, where the tubular structures are perfused with different fluids, may be achieved by adding a separate set of perfusion channels in the multiple tubular structure fixation devices. With the addition of the separate set of perfusion channels, different fluids can be perfuse through different tubular structures simultaneously. Therefore different fluids can be supplied to the scaffold simultaneously. Such an embodiment may be employed to form tissue engineered structures that are separately perfused with different biological fluids.

Figure 8D:
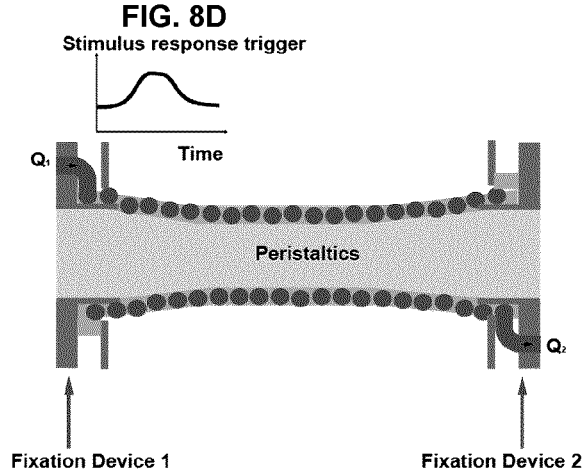

In another example embodiment, illustrated in FIG. 8D, one or more tubular structures may be molded in the wall of a tubular scaffold made of stimulus responsive material, and perfusion may be achieved by using two fixation devices to hold a tubular scaffold. Each of the fixation devices has two fixation holes, one large and one small. The large fixation hole holds the tubular scaffold and the small fixation hole holds the hydrogel tubular structure which is wrapped around, and molded, in the wall of the tubular scaffold. The scaffold is made by stimulus responsive material, such as electro-response materials (e.g. polypyrrole), temperature responsive materials (e.g. poly(N-isopropylacrylamide) and its block copolymers), pH responsive materials (e.g. poly(acrylamide-co-acrylic acid), poly(methacrylic acid)), magnetive responsive materials (magnetic nanoparticles), light responsive materials (e.g. polymers containing azobenzene, triphenylmethane and spiropyran groups), enzyme responsive materials (e.g. PEG/poly(ethylene oxide)) and glucose responsive. By passing stimulus response trigger solution (e.g. pH change, temperature change, electrical conductivity change or magnetic field change), the scaffold will react to the trigger and give a response (e.g. change in diameter, change in length or bend).

It will be understood that on-chip and off-chip devices and methods disclosed herein may be employed for the fixation of biological or synthetic (artificial or engineered) conduits or tubular structures. The device may allow fixation and perfusion of human-, animal-, and plant-derived flow conduits or artificial conduits. For example, tubular structures that may be fixated and optionally perfused within such devices include, but are not limited to, tubular structures formed according to the devices and methods described in the present disclosure, and flow conduits from any organ. A flow conduit may include conduits found in organisms, such as lipid tubules, engineered vessels, hollow fibers, arteries, arterioles, veins, venules, lymphatic vessels, intestines, vas deferens, ovaric tubes, bile ducts, bronchial tubes, bronchiole, trachea, or any other similar structures, as well as structures found in plants. The devices and methods disclosed herein may also allow for targeted or personalized treatment of either an individual or groups of individual by using their representative conduits in screening for or assessment of certain drugs, diseases, conditions, or treatments. The devices and methods disclosed herein may be employed to allow structural and response testing of flow conduits, for example in the identification of treatment products.

The following examples are presented to enable those skilled in the art to understand and to practice embodiments of the present disclosure. They should not be considered as a limitation on the scope of the disclosure, but merely as being illustrative and representative thereof.

EXAMPLES

Example 1: PDMS Device Design and Fabrication

The multilayered microfluidic, single-step tubular structure extrusion device is fabricated using a previously described technique called multilayer soft lithography[100] and a combination of cast and spin-coated PDMS layers. Each layer is partially cured by baking at 80° C. for a short time (approximately 15 minutes) before being aligned under microscope and pressed together. The alignment of layers for homogeneous or heterogeneous tubular structure formation is then fully cured and the extrusion outlet is carefully punched.

For example, according to one fabrication protocol, transparency mask designs were prepared in a computer aided design (CAD) program (AutoCAD 2011, Autodesk, CA, USA) and photomasks were printed at 20 000 DPI (CAD/ART Services, OR, USA). Using standard soft lithography techniques, microchannel patterns on transparency masks were transferred to masters for successive replica molding of each layer[99]. Briefly, 3"×4" glass slides (Corning Inc., Corning, N.Y., USA) were rinsed with isopropanol, acetone, and then isopropanol-and dehydrated on a hot plate (HP30A, Torrey Pines Scientific, CA, USA) at 200° C. for 30 minutes. Slides were cooled to 65° C. and then treated with oxygen plasma for 30 seconds (PDC-32G, Harrick Plasma, NY, USA). Using a layer of SU-8 25 negative photoresist (Microchem, MA, USA), a seed layer was spun on each slide at 2000 rpm for 30 seconds using a SCS G3 spin coater (Specialty Coating Systems, IN, USA) and soft baked at 65° C. and 95° C. for a total of 10 minutes. The seed layers were exposed to UV light (365 nm) for 13 seconds (Model 200, OAI, CA, USA), and then baked again for 6 minutes at 95° C. Feature heights of 150 µm were achieved by spinning two 75 µm layers of SU-8 2050 negative photoresist (Microchem, MA, USA) at 1900 RPM for 30 seconds and soft baking in between spins for 5 minutes at 65° C. and 15 minutes at 95° C. After the second 75 µm layer, the slides were baked for 15 minutes at 65° C. and 45 minutes at 95° C. Using the photomasks, the channel features were exposed to 365 nm UV light at 320 J. Post-exposure, the slides were hard baked for 20 minutes at 95° C. and then developed in SU-8 Developer (Microchem, MA, USA) for 10 minutes. The masters were then rinsed with isopropanol, dried under $N_2$, and baked for 15 minutes at 80° C.

To obtain consistently bonded multilayer devices, a partial curing and bonding technique was adopted from previously established protocols[100] and combined with traditional full curing of some of the feature layers. PDMS pre-polymer and curing agent were mixed well at a ratio of 10:1 and was spun onto masters at 400 rpm for 30 seconds, resulting in a final feature layer thickness of 400 µm. The top layer was not spin coated but rather covered with ~0.5 cm layer of uncured PDMS in a dish that was fully baked and peeled off the mold to bond with the next, partially cured layer during the fabrication sequence. The masters were degassed in −25 mmHg at room temperature for 1 hour, and then the top layer was fully baked at 80° C. for 20 minutes. The second layer was baked at 80° C. for approximately 9 minutes. After being partially cured, the thicker top layer was aligned with respect to the sticky second layer and air bubbles were carefully removed. The combined layers were baked for 12 minutes to ensure consistent bonding. The approach was successively repeated until all layers were bonded together. After bonding, inlet holes were punched for all layers and both top and bottom were sealed with partially cured PDMS sheets with no features.

Example 2: Experimental Results

Using the devices described in FIG. 2A with independent inner and outer streaming, 2% alginate gel tubular structures were routinely extruded and the range of geometries was characterized. Tubular structures were formed, shown in FIG. 3B, with in the flow rates ranges $Q_m=10$ µl/min to $Q_m=400$ µl/min, inner streaming flow rate $Q_i=5$ µl/min to $Q_i=4.5$ ml/min and outer streaming flow rate of $Q_o=0$ µl/min to $Q_o=4.5$ ml/min. Outside the flow rates ranges, the gel formation was unstable and breakup was observed at the device outlet.

Tunable wall thickness and outer diameter was demonstrated with wall thicknesses between 40 µm and 400 µm, and a dynamic outer diameter range between 750 µm and 2400 µm. The range of thicknesses and diameters are a function of the relative matrix and streaming flow rates, but also a function of the device design, fabrication process, and outlet hole diameter. The outlet hole diameter does not limit the upper end of the diameter range. Tubular structures of diameters larger than the outlet hole can be produced with a confinement and without outer streaming.

In FIG. 3C-E, confocal and brightfield images of single layer tubular structures (FIG. 4A) are shown demonstrating uniform wall thickness and intact 3D structure. As an example of the ability to control cross-sectional tubular structure features, a tubular structure with variable matrix A-matrix B composition (FIG. 2B, 2E) is demonstrated in FIG. 4A-G.

Example 3: Tubular Structures as Programmable/Stimulus Responsive Materials and Soft Robotic Elements In one example implementation, tubular structures may be extruded containing stimulus responsive matrix materials or payloads, thus rendering the extruded tubular structures stimulus responsive. For example, using the aforementioned methods for the extrusion of tubular structures, a stimulus responsive secondary material may be locally added to a variety of polymeric matrix materials, such as hydrogels and elastomers, to render the tubular structures stimulus responsive and optionally to cause a desirable and/or predictive shape change.

Upon a pH or temperature change that may be either provided on the tubular structure inside or outside, or on both sides, tubular structures may undergo predictive shape changes. Examples of such shape changes include bending, twisting and buckling. Deformations may include spirals with stimulus responsive curvature radii, as well as rolled-up tubular structure assemblies that change bulk dimensions upon stimulus response. Long tubular structures containing localized swelling and de-swelling materials can be predictably deformed to create specific shapes or words.

For example, with the addition of a programmable material to an alginate matrix, such as poly(N-isopropylacrylamide co vinyl acetic acid), which is a pH responsive material, selective swelling and de-swelling can be triggered and observed on-chip.

Example 4: Formation of Extended Tubular Structures and Perfusable Bulk Soft Structures The formation of long tubular structures and optional assembly into bulk soft structures can be achieved in several ways. In one example implementation, the assembly of tubular structure segments can be achieved via the union of stimulus responsive tubular structure sections, or unions of stimulus responsive tubular structure sections with non-stimulus responsive tubular structures. Such unions can be obtained by separating (e.g., cutting) a stimulus responsive tubular structure into different sections. Two sections will be immersed in different solutions (different pH or temperature) with the result that their diameters are different. In cases where the inner diameter of one tubular structure segment is greater than the outer diameter of the other, the larger diameter segment can slide on top of the smaller diameter segment. Once the tubular structure sections partially overlap, they will be subject to the same stimulus (pH or T) and therefore create a union. The described process can be repeated successively to add more tubular structure sections to the assembly.

In another example embodiment, extruded tubular hydrogel structures can be formed by the collection and winding of continuous tubular structures to form large perfusable assemblies. These assemblies can be cast into other hydrogels or gelling agents to form functionally responsive and perfusable organized bulk material blocks.

Using these methods, the formation of large volumes (several milliliters and more) of a uniformly perfusable, programmable soft material can be obtained in a systematic, scalable manner. The bulk material can be obtained by either rolling up tubular structure segments onto a cylindrical surface (in the axial and radial directions), or by linearly stacking them. Depending on the composition of the tubular structures and the nature of the tubular assembly, bulk materials that either show stimulus responsiveness in only one, in two, or in all three directions can be obtained.

Example 5: Other Cross-Sectional Profiles of Extruded Structures

Extending the continuous extrusion process from circular cross-sections may enable the extrusion of more complex structures and assemblies. Though uniform composition is demonstrated in most cases in FIGS. 5A-G, the composition may in fact vary at different faces or along the circumferential direction.

The shape of the inner wall of the tubular structure can be altered simply by changing the streaming flow rates. Ramping inner streaming flow rate $Q_i$ above 2.5 mL/min and decrease $Q_o$ 100 μL/min to will produce tubular structures with wiggling inner wall (FIG. 4H). Star shape inner wall tubular structure can be produced by decreasing $Q_i$ below 100 μL/min and increasing $Q_o$ to 1200 μL/min. In both cases, $Q_m$=200 μL/min.

In other example implementations, controllable variations in the outer surface of extruded tubular structures can be created (FIG. 8K-L), which can also be extended to generate controlled variations in the inner surface.

Individually addressable internal channels can be created in extruded tubular structures (FIG. 5A). Similar to electrical ribbon cable or round cable, continuously extruded and perfusable tubular structure assemblies with controlled tubular structure spacing and overall structure (FIG. 5D-F) can be produced in an analogous fashion as individual tubular structures or tubular structure-like extruded cross-sections.

Example 6: Tubular Structure Extrusion Device Design

The presented method for extruding single-layer homogeneous tubular structures uses a three-layer microfluidic device, as shown in FIG. 2A. The three fluidic layers are arranged such that a single biopolymer matrix layer is surrounded, top and bottom, by crosslinking solution. Each layer contains the same key features: the solution, for a given layer, is distributed evenly from a single inlet such that all channels contain the same resistance, the channels are arranged in a radial configuration around the common outlet hole and the diameter of the outlet configuration is larger than the punched outlet. These features make the device robust, reusable and resistant to small variations in layer alignment. The biopolymer layer differs from the crosslinker layers in its width only, ensuring that adjacent layers have as little channel overlap as possible.

The layers are carefully aligned, under a stereomicroscope, during fabrication such that the fluids interact, beginning gelification, at the common, punched outlet and enable the continuous vertical extrusion of hydrogel tubular structures. From the top down the layers are arranged: inner crosslinking, biopolymer matrix and outer crosslinking fluid. The extrusion hole is punched through all layers in the centre of the circular channel configuration. The 3.175 mm diameter punch is smaller than the 4 mm channel configuration allowing the liquids to distribute evenly around the outlet, even if the two features are not perfectly concentric. The syringe-pump driven liquids are run through 150 μm deep channels to 24 identical outlet channels that are 300 μm wide. The simple design makes it easy to add more vertically-aligned layers during fabrication to create multilayered, multi-material tubular structures. For example, aligning n matrix layers in between the crosslinking layers permits the formation of n-layered tubular structures with a different compatible material for each layer. Furthermore, small changes to the matrix layer design can introduce specific heterogeneities within a layer, such as, multi-material cross sections, patterned spots and/or stripes. The range of tubular structure formation diameters can be expanded by punching a smaller hole through the same device design or by increasing the diameter of the channel outlet configuration.

Upon reaching the exit of the microfluidic device, the crosslinking fluids and the polymerizing matrix are guided through a confining tygon conduit (confinement) that maintains cylindrical flow outside the device, as the hydrogel solidifies. The confinement has a 3.175 mm diameter to match that of the extrusion hole. The minimum flow rates (minimum total flow rate) are then calculated for the extrusion hole/confinement diameter such that there is no back-flow into the exit of the confinement conduit. The confinement is 2.54 cm long and leads into a crosslinker filled reservoir, with a lower density than the three other fluids to allow gravity-driven extrusion. The size of the confining conduit is altered with diameter of the punched extrusion hole.

Example 7: Tubular Structure Formation

FIG. 3A shows a schematic illustration of the experimental setup used for the formation of single hydrogel tubular structures and illustrates the assumed radial distribution of the fluid velocity in an analytical model that we use as a complement to the experimental investigations. The biopolymer solution gets in contact with crosslinker solutions at the exit hole of the device and enters a confinement. The biopolymer solution forms a cylindrical flow where its inner and outer walls are both in contact with crosslinker solutions. The inner and outer surfaces of the biopolymer gel instantly and define the tubular structure shape of the hydrogel. Crosslinker reaches the inner region of the tubular structure wall by diffusion which happens during and after the extrusion process. The inner crosslinker solution flow rate $Q_I$, the outer crosslinker solution flow rate, $Q_O$, and the biopolymer solution flow rate, $Q_M$, are controlled independently by syringe pumps. Therefore, the inner diameter, the wall thickness and the outer diameter of the tubular structure can be controlled independently.

Example 8: Analytical Model of Tubular Structure Formation

The flow rates of the solutions are controlled parameters in this model. As the inner and outer surfaces of the tubular structure wall are solidified almost instantly, the formation of the tubular structure can be divided into two stages. In the first stage, as all the solutions are in liquid state, the relative volumes of solutions in the confinement are governed by their relative flow rates. In the second stage where as the inner and outer surface of the tubular structure wall are formed, the flow can be seen as a moving tubular structure with template fluid inside and streaming outside. FIG. 3a shows the velocity profile of the 3 fluids along the radius of the confinement. Shear only occurs at the outer surface of the tubular structure wall. The crosslinker solutions are Newtonian fluid so the flow velocity profile is parabolic between the hydrogel tubular structure outer wall surface and the confinement surface.

The flow rate of the outer fluid can be expressed as $$Q_o = \int_{r_o}^{r_c} \left( V_m - \frac{V_m(r-r_o)^2}{(r_c-r_0)^2} \right) 2\pi r dr \qquad (1)$$

$$Q_o = \frac{2\pi V_m}{(r_c-r_o)^2} \left[ \frac{r_c^2 r^2}{2} - r_c r_o r^2 + \frac{2 r_o r^3}{3} - \frac{r^4}{4} \right]_{r_o}^{r_c},$$

where $V_M$ is the fluid velocity of the matrix stream, $r_C$ is the inner radius of the confinement conduit, $r_O$ is the outer radius of the formed tubular structure. For the flow rate of the inner stream flow rate follows $$Q_i = V_m \pi r_i^2. \qquad (2)$$

Where $r_i$ is the inner radius of the formed tubular structure. The matrix flow rate follows as $$Q_M = V_m \pi (r_o^2 - r_i^2). \qquad (3)$$

Example 9: Operating Parameter Space for Fixed $Q_M$

FIG. 3b shows the parameter space available for successful tubular structure formation for the case of ionic cross linking of an alginate solution at a fixed value of $Q_M$=200 µL/min, while $Q_I$ and $Q_O$ were varied over several orders of magnitude. Consistent tubular structure formation was observed over a wide range of parameters, indicating the robustness of the approach.

Example 10: Control Over Tubular Structure Dimensions

By varying the flow rates, the tubular structure diameter and thickness can be controllably changed. A series of flow rate combinations were selected to compare the experimental results with the predictions from the analytical model. The total flow rate of the biopolymer solution and the cross-linking solutions, $Q_I+Q_M-Q_O$, was kept constant at 1500 µL/min and the biopolymer solution flow rate remained at $Q_M$=200 µL/min. Model predictions agreed favourably with the experimental data in most of the conditions except for conditions associated with high and low $Q_O/Q_I$ ratios (FIG. 3F). At the high $Q_O/Q_I$ ratios, the rapid gelation of the inner surface device defined the inner circumference of the inner tubular structure wall and diameter. While the cross sectional area occupied by inner fluid decreased due to low flow rate, the inner wall of the tubular structure displayed protrusions in order to comply with a further reduction in diameter. Consequently, the experimentally obtained tubular structure wall thickness values exceeded the ones predicted by the model. For low $Q_O/Q_i$ ratios, the rapid gelation occurring at the outer surface of the tubular structure wall limited the outer diameter of the tubular structure. Measured tubular structure diameters were therefore smaller than the ones predicted by the model.

Example 11: Elasticity of Tubular Structures

In this Example, the diameter change due to perfusion with segmented (bubble or droplet) flow is estimated, with E=10-100 kPa, K=2.15×10$^9$ Pa/m$^2$, $\sigma_{water}$=0.072 N/m, $\sigma_{LT\ Solder}$~0.500 N/m, $\Delta P=2\sigma/R$, R=300 µm, D=2R, δ=50 µm. The capillary pressure is $$\Delta P = \frac{2\sigma}{R}$$

and the corresponding transmural pressure difference results in the force F=$\Delta P \cdot 2\pi \cdot R \cdot \Delta x$=$4\pi \cdot \sigma \cdot \Delta x$. Taking into account the elasticity of the tubular structure wall with $$E = \frac{FA^{-1}}{\Delta L L^{-1}} = \frac{F(\Delta x \cdot \delta)^{-1}}{\Delta D D^{-1}}$$

the diameter change can be expressed as $$\frac{\Delta D}{D} = \frac{F}{\Delta x \cdot \delta} \frac{1}{E} = \frac{4\pi \cdot \sigma}{\delta \cdot E}.$$

For water ($\sigma_{Water}$=0.072 N/m, K=2.15 10$^9$ N/m$^2$), a tubular structure of 600 µm diameter, 100 µm thickness and E=100 kPa is $$\frac{\Delta D}{D} = 9\%.$$

This corresponds to the case of gas bubbles in (clear) water and should therefore be clearly measurable with a capillary pressure of ~500 Pa (5 cm water column). Flowing segments of (liquid) low temperature solder in say aqueous solution would provide an interfacial tension of 0.43 N/m and, for the same tubular structure, a value of $$\frac{\Delta D}{D} = 63\%.$$

The ability to routinely determine the elasticity of chip hosted hydrogel tubular structures (in the circumferential direction) is of key importance, for instance for performing degradation studies of biomaterials alone, or cell-laden biomaterials.

Example 12: In-Line Elasticity Measurement of Reversibly Fixated Tubular Structures In addition to determining the tubular structure elasticity by pressurization, measurements can be based on the speed of a sound wave that passes through the tubular structure. This pulse wave velocity methodology is clinically used for determining arterial stiffness in vivo. The critical velocity can be estimated in the limit of small deformations as $c = \sqrt{K/\rho(1+KD/E\delta)}$. For the flow of water ($\rho=1000$ kg/m$^3$, K=2.15 $10^9$ N/m$^2$) the critical velocity is c~4 m/s with $\delta=100$ µm and E=100 kPa.

Example 13: Heterogeneous Tubular Structures

The inventors have experimentally demonstrated the formation of tubular structures homogeneous composition and complex wall geometries as well as the formation of circular cross section tubular structures with a heterogeneous composition. FIG. 5 shows different heterogeneous tubular structures that have been consistently formed.

Aligning n matrix layers in between the crosslinking layers permits the formation of n-layered tubular structures with a different compatible material for each layer. In FIG. 4A, the 3 layers of the tubular structure are alginate doped with different dyes. By caging a slow gelling biopolymer in between two layers of fast gelling biopolymer, the fast gelling biopolymer can act as a template which temporarily holds the slow gelling biopolymer in shape, to give it enough time to crosslink into hydrogel tubular structure. Collagen solution can be extruded in between two cylindrical layers of alginate solutions. Alginate solutions will gel instantly and hold collagen solution in a tubular structure shape. The tubular structure is then transferred to an incubator (37° C.) for collagen to crosslink. After collagen is crosslinked completely, alginate layers are then dissolved using ethylenediaminetetraacetic acid (EDTA). At the end, a single layer collagen tubular structure can be produced. This tubular structure is produced by device in FIG. 2E.

Small changes to the matrix layer design can introduce specific heterogeneities within a layer, such as, multi-material cross sections, patterned spots and/or stripes. These tubular structures are produced by using device in FIG. 2B. The amount spotting biopolymer per spot is controlled by the pressure and opening time of the inlet of the spotting channels, so is the spot size. FIGS. 4C and 4D show that smaller spots are generated by smaller pressure. Stripes of second biopolymer can be produced along the tubular structure axial direction by leave the spotting channel open all time (FIG. 4E).

Each spotting channel can be independently controlled, as illustrated in FIG. 4F. Also, multiple spots can be produced at the same time, as shown in FIG. 4G.

FIG. 4I shows a tubular structure change in diameter in its axial direction. This tubular structure can be formed by varying the flow rate of crosslinker fluids during tubular structure formation using device in FIG. 2A. While keeping $Q_m$ constant, increase Qi or decrease Qo will lead to an increase in tubular structure diameter. Decrease Qi or increase Qo will lead to a decrease in tubular structure diameter.

By adding another feeding channel or switch biopolymer going into the microfluidic device, the composition of the tubular structure can be changed along the axial direction (FIG. 4J).

The extrusion of bilayer tubular structure is similar to trilayer tubular structure but using one less biopolymer channel in the microfluidic device, as shown in FIG. 4K.

As mentioned earlier, N-layer tubular structure (FIG. 4L) can be formed simply by having N biopolymer solution layers in the microfluidic device. This shows the scalability of the multilayer tubular structure formation device design. Half-half tubular structures with different compositions on each half can be produced using device in FIG. 2D, as shown in FIG. 4M. Furthermore, using the spotting device (FIG. 2B) and feed crosslinkers instead of biopolymers in the spotting channels produces a porous tubular structure, as illustrated in FIG. 4N.

Example 14: Alternative for Microfluidic Array for Generating Flow Resistance

Figure 9A:
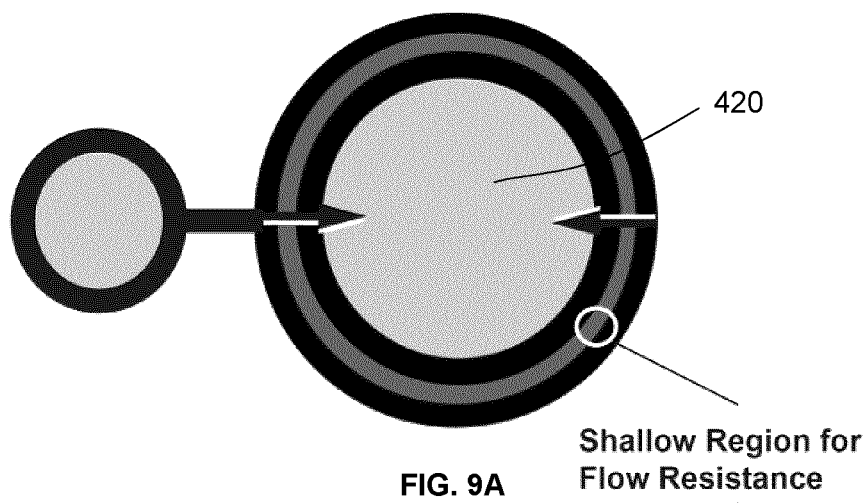
FIGS. 9A and 9B illustrate an alternative embodiment for creating flow resistance in the vicinity of the common central output of a microfluidic device, using a very narrow gap instead of a network of microfluidic channels.
Figure 9B:
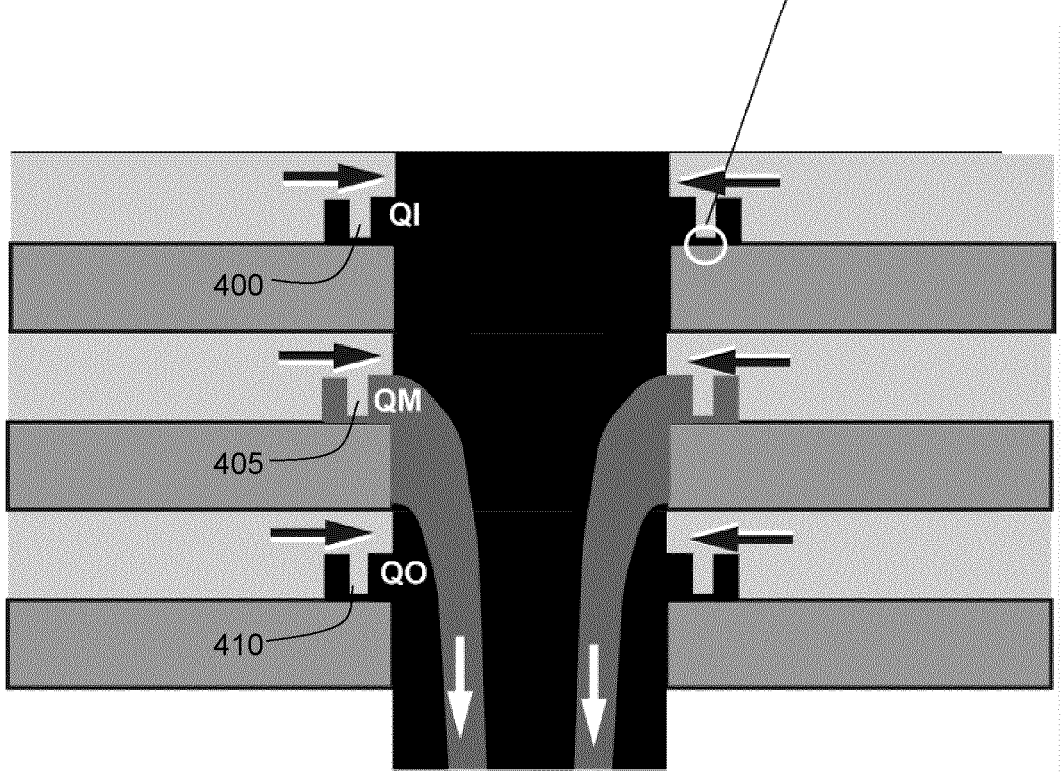

Although the preceding embodiments and examples have employed the use of an inwardly directed array of microfluidic channels to create flow resistance for circumferentially distributing flowing fluids around the common central aperture of a microfluidic device, it will be understood that alternative mechanisms may be employed to evenly distribute the fluid as it flows towards the common central outlet. FIGS. 9A and 9B illustrate one such alternative embodiment, in which fluidic resistance for evenly distributing the incoming fluid around the common central output is achieved using shallow gaps 400, 405 and 410, that are located adjacent to the common central opening 420, such that the incoming fluid encounters the gap and experiences fluidic resistance, thereby leading to the even distribution of fluid around the common central outlet. Such a fluidic resistance gap could be readily fabricated in number of different types of materials, such as, for example, glass, hard plastic and silicon. Such an embodiment is one example of an alternative design that avoids the need for an array of microfluidic channels near the common central output.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

REFERENCES

1. Yamada, M., Sugaya, S., Naganuma, Y. & Seki, M. Microfluidic synthesis of chemically and physically anisotropic hydrogel microfibers for guided cell growth and networking. *Soft Matter* 8, 3122-3130 (2012).
2. Cho, S., Shim, T. S. & Yang, S.-M. High-Throughput Optofluidic Platforms for Mosaicked Microfibers toward Multiplex Analysis of Biomolecules. *Lab on a Chip* (2012).doi: 10.1039/C2LC40439G
3. Choi, N. W. et al. Microfluidic scaffolds for tissue engineering. *Nature materials* 6, 908-15 (2007).
4. Kang, E. et al. Digitally tunable physicochemical coding of material composition and topography in continuous microfibres. *Nature materials* 10, 877-83 (2011).
5. Mulvany, M. J. & Halpern, W. Contractile properties of small arterial resistance vessels in spontaneously hypertensive and normotensive rats. *Circulation research* 41, 19-26 (1977).
6. Günther, A. et al. A microfluidic platform for probing small artery structure and function. *Lab on a chip* 10, 2341-9 (2010).
7. Laschke, M. W. et al. Angiogenesis in tissue engineering: breathing life into constructed tissue substitutes. *Tissue engineering* 12, 2093-104 (2006).
8. Gerecht-Nir, S., Cohen, S., Ziskind, A. & Itskovitz-Eldor, J. Three-dimensional porous alginate scaffolds provide a conducive environment for generation of well-vascularized embryoid bodies from human embryonic stem cells. *Biotechnology and bioengineering* 88, 313-20 (2004).
9. Lutolf, M. P. & Hubbell, J. a Synthetic biomaterials as instructive extracellular microenvironments for morphogenesis in tissue engineering. *Nature biotechnology* 23, 47-55 (2005).
10. Shin, H., Jo, S. & Mikos, A. G. Biomimetic materials for tissue engineering. *Biomaterials* 24, 4353-4364 (2003).
11. Warren, W. L. et al. Architecture tool and methods of use. U.S. Pat. No. 6,986,739 B2 (2006).
12. Boland, T., Wilson Jr., Wi. C. & Xu, T. Ink-Jet Printing of Viable Cells. U.S. Pat. No. 7,051,654 B2 (2006).
13. Moreno, M. J., Levesque, P. & Thibodeau, J. M. Cell Seeding Module. U.S. Pat. No. 8,173,420 B2 (2012).
14. Carroll, D., Wagner, W., Levi, N., Argenta, L. & Morykwas, M. Methods and compositions for printing biologically compatible nanotubular structure composites of autologous tissue. US Patent Application US 2009/0117087 A1 (2009).
15. Yoo, J., Xu, T. & Atala, A. Ink-Jet Printing of Tissues. US Patent Application US 2009/0208466 A1 (2009).
16. Kwang, H.-W., Lee, S. J., Atala, A. & Yoo, J. J. Integrated organ and tissue printing methods, system, and apparatus. US Patent Application US 2012/0089238 A1 (2012).
17. Xu, T., Yoo, J. J., Atala, A. & Dice, D. Inkjet printing of tissues and cells. US Patent Application US 2009/0208577 A1 (2009).
18. Gonda, S. R. et al. Micro-organ device. US Patent Application US 2008/0261288 A1 (2008).
19. Sun, W. et al. Compositions and methods for functionalized patterning of tissue engineering substrates including bioprinting cell-laden constructs for multi-compartment tissue chambers. US Patent Application US 2011/0136162 A1 (2011).
20. Ping, J., Wijn, J. R. De, Blitterswijk, C. A. Van & Groot, K. De Porous Ti 6 Al 4 V scaffold directly fabricating by rapid prototyping: Preparation and in vitro experiment. *Biomaterials* 27, 1223-1235 (2006).
21. Ping, J. et al. Bone ingrowth in porous titanium implants produced by 3D fiber deposition. *Biomaterials* 28, 2810-2820 (2007).
22. Moroni, L., Schotel, R., Sohier, J., Wijn, J. R. De & Blitterswijk, C. A. Van Polymer hollow fiber three-dimensional matrices with controllable cavity and shell thickness. *Biomaterials* 27, 5918-5926 (2006).
23. Jensen, G., Carvalho, C., Mu, R., Gellrich, N. & Menger, M. D. Incorporation of growth factor containing Matrigel promotes vascularization of porous PLGA scaffolds. *Journal of Biomedical Materials Research Part A* 397-407 (2007).doi:10.1002/jbm.a.31503
24. Fedorovich, N. E. et al. Evaluation of Photocrosslinked Lutrol Hydrogel for Tissue Printing Applications. *Biomacromolecules* 10, 1689-1696 (2009).
25. Carvalho, C., Lang, M. & Folio, M. Bacterial and Candida albicans adhesion on rapid prototyping-produced 3D-scaffolds manufactured as bone replacement materials. *Journal of Biomedical Materials Research Part A* 933-943 (2008).doi:10.1002/jbm.a.31832
26. Ru, M. et al. Angiogenic and inflammatory response to biodegradable scaffolds in dorsal skinfold chambers of mice. *Biomaterials* 27, 5027-5038 (2006).
27. Yilgor, P., Sousa, R. A., Reis, R. L., Hasirci, N. & Hasirci, V. 3D Plotted PCL Scaffolds for Stem Cell Based Bone Tissue Engineering. *Macromol. Symo,* 269, 92-99 (2008).
28. Moroni, L., Wijn, J. R. De & Blitterswijk, C. A. Van 3D fiber-deposited scaffolds for tissue engineering: Influence of pores geometry and architecture on dynamic mechanical properties. *Biomaterials* 27, 974-985 (2006).
29. Jakab, K. et al. Tissue engineering by self-assembly and bio-printing of living cells. *Biofabrication* 2, 022001 (2010).
30. Marga, F. et al. Toward engineering functional organ modules by additive manufacturing. *Biofabrication* 4, 022001 (2012).
31. Neagu, A., Jakab, K., Jamison, R. & Forgacs, G. Role of Physical Mechanisms in Biological Self-Organization. *Physical Review Letters* 95, 178104 (2005).
32. Jakab, K. et al. Tissue engineering by self-assembly of cells printed into topologically defined structures. *Tissue engineering*. Part A 14, 413-21 (2008).
33. Jakab, K., Neagu, A., Mironov, V., Markwald, R. R. & Forgacs, G. Engineering biological structures of prescribed shape using self-assembling multicellular systems. *Proceedings of the National Academy of Sciences of the United States of America* 101, 2864-9 (2004).
34. Nakamura, M. et al. Biocompatible inkjet printing technique for designed seeding of individual living cells. *Tissue engineering* 11, 1658-66 (2005).
35. Cui, X. & Boland, T. Human microvasculature fabrication using thermal inkjet printing technology. *Biomaterials* 30, 6221-7 (2009).
36. Xu, T., Jin, J., Gregory, C., Hickman, J. J. J. J. & Boland, T. Inkjet printing of viable mammalian cells. *Biomaterials* 26, 93-9 (2005).
37. Ilkhanizadeh, S., Teixeira, A. I. & Hermanson, O. Inkjet printing of macromolecules on hydrogels to steer neural stem cell differentiation. *Biomaterials* 28, 3936-43 (2007).
38. Roth, E. a et al. Inkjet printing for high-throughput cell patterning. *Biomaterials* 25, 3707-15 (2004).
39. Barbulovic-Nad, I. et al. Bio-microarray fabrication techniques—a review. *Critical reviews in biotechnology* 26, 237-59 (2006).
40. Tavana, H. et al. Nanolitre liquid patterning in aqueous environments for spatially defined reagent delivery to mammalian cells. *Nature materials* 8, 736-41 (2009).
41. Guillemot, F. et al. High-throughput laser printing of cells and biomaterials for tissue engineering. *Acta biomaterialia* 6, 2494-500 (2010).

42. Mironov, V., Prestwich, G. & Forgacs, G. Bioprinting living structures. *Journal of Materials Chemistry* 17, 2054 (2007).
43. Lee, W. et al. Multi-layered culture of human skin fibroblasts and keratinocytes through three-dimensional freeform fabrication. *Biomaterials* 30, 1587-95 (2009).
44. Guillotin, B. & Guillemot, F. Cell patterning technologies for organotypic tissue fabrication. *Trends in biotechnology* 29, 183-90 (2011).
45. Campbell, P. G. & Weiss, L. E. Tissue engineering with the aid of inkjet printers. *Expert opinion on biological therapy* 7, 1123-7 (2007).
46. Norotte, C., Marga, F. S., Niklason, L. E. & Forgacs, G. Scaffold-free vascular tissue engineering using bioprinting. *Biomaterials* 30, 5910-7 (2009).
47. Skardal, A., Zhang, J. & Prestwich, G. D. Bioprinting vessel-like constructs using hyaluronan hydrogels crosslinked with tetrahedral polyethylene glycol tetracrylates. *Biomaterials* 31, 6173-81 (2010).
48. Weinberg, C. B. & Bell, E. A blood vessel model constructed from collagen and cultured vascular cells. *Science* 231, 397-400 (1986).
49. Niklason, L. E. Replacement arteries made to order. *Science* 286, (1999).
50. McKee, J. A. et al. Human arteries engineered in vitro. *EMBO reports* 4, 633-8 (2003).
51. Heureux, N. L. et al. Human tissue-engineered blood vessels for adult arterial revascularization. *Nature Medicine* 12, 361-365 (2006).
52. L'Heureux, N., Germain, L., Labbé, R. & Auger, F. a In vitro construction of a human blood vessel from cultured vascular cells: a morphologic study. *Journal of vascular surgery: official publication, the Society for Vascular Surgery [and] International Society for Cardiovascular Surgery, North American Chapter* 17, 499-509 (1993).
53. Schaner, P. J. et al. Decellularized vein as a potential scaffold for vascular tissue engineering. *Journal of Vascular Surgery* 40, 146-153
54. Amiel, G. E. et al. Engineering of Blood Vessels from Acellular Collagen Matrices Coated with Human Endothelial Cells. *Tissue Engineering* 12, (2006).
55. Zhao, Y. et al. The development of a tissue-engineered artery using decellularized scaffold and autologous ovine mesenchymal stem cells. *Biomaterials* 31, 296-307 (2010).
56. Hilbert, S. L., Boerboom, L. E., Livesey, S. A. & Ferrans, V. J. Explant pathology study of decellularized carotid artery. *Journal of Biomedical Materials Research* (2004).doi: 10.1002/jbm.a.10135
57. Wang, Z., He, Y. & Yu, X. Rapid vascularization of tissue-engineered vascular grafts in vivo by endothelial cells in co-culture with smooth muscle cells. *Tissue Engineering* 1109-1117 (2012).doi:10.1007/s10856-012-4576-8
58. Roy, S. et al. Biomechanical proprieties of decellularized porcine common carotid arteries. *Am J Physiol Heart Circ Physiol* 289, H1567-H1576 (2005).
59. Williams, C. et al. Altered structural and mechanical properties in decellularized rabbit carotid arteries. *Acta Biomaterialia* 5, 993-1005 (2009).
60. Buttafoco, L. et al. Electrospinning of collagen and elastin for tissue engineering applications. *Biomaterials* 27, 724-34 (2006).
61. Wang, W. et al. Influences of mechanical properties and permeability on chitosan nano/microfiber mesh tubular structures as a scaffold for nerve regeneration. *Journal of Biomedical Materials Research Part A* (2007).doi: 10.1002/jbm.a
62. Thorvaldsson, A., Stenhamre, H., Gatenholm, P. & Walkenström, P. Electrospinning of highly porous scaffolds for cartilage regeneration. *Biomacromolecules* 9, 1044-9 (2008).
63. Agarwal, S., Wendorff, J. H. & Greiner, A. Progress in the field of electrospinning for tissue engineering applications. *Advanced materials* 21, 3343-51 (2009).
64. Okuzaki, H., Harashina, Y. & Yan, H. Highly conductive PEDOT/PSS microfibers fabricated by wet-spinning and dip-treatment in ethylene glycol. *European Polymer Journal* 45, 256-261 (2009).
65. Fukae, R., Maekawa, A. & Sangen, O. Gel-spinning and drawing of gelatin. *Polymer* 46, 11193-11194 (2005).
66. Dalto, P. D. & Shoichet, M. S. Creating porous tubular structures by centrifugal forces for soft tissue application. *Biomaterials* 22, 2661-9 (2001).
67. Yuan, B. et al. A Strategy for Depositing Different Types of Cells in Three Dimensions to Mimic Tubular Structures in Tissues. *Advanced Materials* 24, 890-896 (2012).
68. Hofmann, O., Niedermann, P. & Manz, a Modular approach to fabrication of three-dimensional microchannel systems in PDMS-application to sheath flow microchips. *Lab on a chip* 1, 108-14 (2001).
69. Nieuwenhuis, J. H., Bastemeijer, J., Sarro, P. M. & Vellekoop, M. J. Integrated flow-cells for novel adjustable sheath flows. *Lab on a chip* 3, 56-61 (2003).
70. Hwang, C. M., Khademhosseini, A., Park, Y., Sun, K. & Lee, S.-H. Microfluidic chip-based fabrication of PLGA microfiber scaffolds for tissue engineering. *Langmuir: the ACS journal of surfaces and colloids* 24, 6845-51 (2008).
71. Jeong, W. et al. Hydrodynamic microfabrication via"on the fly" photopolymerization of microscale fibers and tubular structures. *Lab on a chip* 4, 576-80 (2004).
72. Lan, W., Li, S., Lu, Y., Xu, J. & Luo, G. Controllable preparation of microscale tubular structures with multiphase co-laminar flow in a double co-axial microdevice. *Lab on a chip* 9, 3282-8 (2009).
73. Choi, C.-H., Yi, H., Hwang, S., Weitz, D. A. & Lee, C.-S. Microfluidic fabrication of complex-shaped microfibers by liquid template-aided multiphase microflow. *Lab on a chip* 11, 1477-1483 (2011).
74. Sugiura, S. et al. Tubular gel fabrication and cell encapsulation in laminar flow stream formed by microfabricated nozzle array. *Lab on a chip* 8, 1255-7 (2008).
75. Sakai, S., Yamaguchi, S., Takei, T. & Kawakami, K. Oxidized alginate-cross-linked alginate/gelatin hydrogel fibers for fabricating tubular constructs with layered smooth muscle cells and endothelial cells in collagen gels. *Biomacromolecules* 9, 2036-41 (2008).
76. Takei, T., Sakai, S., Yokonuma, T., Ijima, H. & Kawakami, K. Fabrication of artificial endothelialized tubular structures with predetermined three-dimensional configuration from flexible cell-enclosing alginate fibers. *Biotechnology progress* 23, 182-6 (2007).
77. Dittrich, P. S., Heule, M., Renaud, P. & Manz, A. On-chip extrusion of lipid vesicles and tubular structures through microsized apertures. *Lab on a chip* 6, 488-93 (2006).
78. Hu, M. et al. Hydrodynamic spinning of hydrogel fibers. *Biomaterials* 31, 863-9 (2010).
79. Raof, N. A., Padgen, M. R., Gracias, A. R., Bergkvist, M. & Xie, Y. One-dimensional self-assembly of mouse embryonic stem cells using an array of hydrogel microstrands. *Biomaterials* 32, 4498-4505 (2011).

80. Su, J., Zheng, Y. & Wu, H. Generation of alginate microfibers with a roller-assisted microfluidic system. *Lab on a chip* 9, 996-1001 (2009).
81. Iwasaki, N., Yamane, S., Majima, T. & Kasahara, Y. Feasibility of Polysaccharide Hybrid Materials for Scaffolds in Cartilage *Tissue Engineering*: Evaluation of Chondrocyte Adhesion to Polyion Complex Fibers Prepared from Alginate and Chitosan. *Bioma* 5, 828-833 (2004).
82. He, C., Kim, S. W. & Lee, D. S. In situ gelling stimuli-sensitive block copolymer hydrogels for drug delivery. *Journal of controlled release: official journal of the Controlled Release Society* 127, 189-207 (2008).
83. Avnir, D., Coradin, T., Lev, O. & Livage, J. Recent bio-applications of sol-gel materials. *Journal of Materials Chemistry* 16, 1013 (2006).
84. Jeong, B., Kim, S. W. & Bae, Y. H. Thermosensitive sol-gel reversible hydrogels. *Advanced drug delivery reviews* 54, 37-51 (2002).
85. Gill, I. & Ballesteros, A. Encapsulation of Biologicals within Silicate, Siloxane, and Hybrid Sol-Gel Polymers: An Efficient and Generic Approach. *Journal of the American Chemical Society* 120, 8587-8598 (1998).
86. Gill, I. & Ballesteros, a Bioencapsulation within synthetic polymers (Part 1): sol-gel encapsulated biologicals. *Trends in biotechnology* 18, 282-96 (2000).
87. Blandino, A., Macias, M. & Cantero, D. Formation of Calcium Alginate Gel Capsules: Influence of Sodium Alginate and CaCl2 Concentration on Gelation Kinetics. *Journal of Bioscience and Bioengineering* 88, 686-689 (1999).
88. Draget, K. I., Skjak-Bråk, G. & Smidsrød, O. Alginate based new materials. *International journal of biological macromolecules* 21, 47-55 (1997).
89. Kuo, C. K. & Ma, P. X. Ionically crosslinked alginate hydrogels as scaffolds for tissue engineering: Part 1. Structure, gelation rate and mechanical properties. *Biomaterials* 22, 511-521 (2001).
90. Drury, J. L., Dennis, R. G. & Mooney, D. J. The tensile properties of alginate hydrogels. *Biomaterials* 25, 3187-99 (2004).
91. Shoichet, M. S., Li, R. H., White, M. L. & Winn, S. R. Stability of hydrogels used in cell encapsulation: An in vitro comparison of alginate and agarose. *Biotechnology and bioengineering* 50, 374-81 (1996).
92. Smidsrød, O. & Skjåk-Braek, G. Alginate as immobilization matrix for cells. *Trends in biotechnology* 8, 71-8 (1990).
93. Kong, H. Designing alginate hydrogels to maintain viability of immobilized cells. *Biomaterials* 24, 4023-4029 (2003).
94. Stevens, M. A rapid-curing alginate gel system: utility in periosteum-derived cartilage tissue engineering. *Biomaterials* 25, 887-894 (2004).
95. Rayatpisheh, S. et al. Aligned 3D human aortic smooth muscle tissue via layer by layer technique inside microchannels with novel combination of collagen and oxidized alginate hydrogel. *Journal of biomedical materials research. Part A* 98, 235-44 (2011).
96. Alsberg, E., Anderson, K. W., Albeiruti, a, Franceschi, R. T. & Mooney, D. J. Cell-interactive alginate hydrogels for bone tissue engineering. *Journal of dental research* 80, 2025-9 (2001).
97. Wang, L. et al. Evaluation of sodium alginate for bone marrow cell tissue engineering. *Biomaterials* 24, 3475-3481 (2003).
98. Tennesen, H. H. & Karlsen, J. Alginate in drug delivery systems. *Drug development and industrial pharmacy* 28, 621-30 (2002).
99. Xia, Y. & Whitesides, G. M. SOFT LITHOGRAPHY. (1998).
100. Unger, M. A., Chou, H., Thorsen, T., Scherer, A. & Quake, S. R. Monolithic Microfabricated Valves and Pumps by Multilayer Soft Lithography. *Science* 288, 113-116 (2000).
101. Leng, L., McAllister, A., Zhang, B., Radisic, M. & Günther, A. Mosaic hydrogels: one-step formation of multiscale soft materials. *Advanced Materials* 24, 3650-8 (2012).

What is therefore claimed is:

1. A method of forming a tubular polymeric material with a microfluidic device, the microfluidic device comprising:
    at least two planar microfluidic layers, each planar microfluidic layer comprising a pair of parallel planar surfaces, wherein the planar microfluidic layers are provided in a stacked configuration, the at least two planar microfluidic layers comprising:
        a planar inner streaming fluid microfluidic layer; and
        a planar matrix microfluidic layer;
    wherein the planar matrix microfluidic layer is provided adjacent to the planar inner streaming fluid microfluidic layer;
    wherein the planar microfluidic layers comprise at least one microfluidic channel in fluid communication a common central outlet, such that fluid flow in each layer is parallel to said planar surfaces and is directed inwardly from a peripheral region towards, and distributed around, the common central outlet;
    the method comprising:
        flowing inner streaming fluid to the planar inner streaming fluid microfluidic layer, and matrix solution to the planar matrix microfluidic layer, such that a tubular sheath of matrix solution is extruded from the common central outlet into a liquid reservoir in a direction that is angled relative said planar surfaces, and such that the inner streaming fluid flows within a lumen defined by the tubular sheath of matrix solution, thereby guiding the tubular sheath of matrix solution; and
        solidifying the tubular sheath of matrix solution into a tubular material as it is extruded from the common central outlet into the liquid reservoir.

2. The method according to claim 1 wherein the microfluidic device further comprises a planar outer streaming fluid microfluidic layer provided adjacent to the planar matrix microfluidic layer, such that the planar matrix microfluidic layer lies between the planar inner streaming fluid microfluidic layer and the planar outer streaming fluid microfluidic layer, the method further comprising:
    flowing outer streaming fluid to the planar outer streaming fluid microfluidic layer, such that the outer streaming fluid externally envelops the tubular sheath of matrix solution, thereby guiding the tubular sheath of matrix solution.

3. The method according to claim 1 wherein the microfluidic device further comprises a guiding conduit having a guiding lumen in fluid communication with the common central outlet, wherein the tubular sheath of matrix solution is guided by the guiding conduit as it emerges from the common central outlet.

4. The method according to claim 1 wherein the common central outlet is circular and wherein the tubular material is formed with a circular cross-section.

5. The method according to claim 1 further comprising controlling the flow rate of the dispensed matrix solution.

6. The method according to claim 1 wherein at least one of the planar microfluidic layers comprises a microfluidic channel surrounding the common central outlet, the microfluidic channel having a gap formed therein for providing fluidic resistance to a fluid flowing through the microfluidic channel toward the central outlet.

7. The method according to claim 1 wherein the planar matrix microfluidic layer comprises a microfluidic array, the microfluidic array comprising an array of microfluidic channels distributed around the common central outlet.

8. The method according to claim 7 wherein the array of microfluidic channels are configured to produce fluidic resistance for achieving an even distribution of fluid around the common central outlet.

9. The method according to claim 7 further comprising controlling the composition of the matrix solution dispensed to one or more of the microfluidic channels of the microfluidic array, such that the composition of the matrix solution that is dispensed by the one or more of the microfluidic channels of the microfluidic array varies with time.

10. The method according to claim 7 wherein each microfluidic channel of the microfluidic array is connected to a common matrix dispensing device for delivering a common matrix solution to the array of microfluidic channels, and wherein the tubular material is formed with a homogeneous composition.

11. The method according to claim 7 wherein different matrix solutions are delivered to at least two different microchannels of the microfluidic array, such that the tubular material is formed with a heterogenous cross-sectional composition.

12. The method according to claim 1 wherein the microfluidic device comprises one or more additional planar matrix microfluidic layers, the method further comprising dispensing different matrix fluids to each additional planar matrix microfluidic layer such that the tubular sheath of matrix solution comprises multiple layers formed from the different matrix solutions.

13. The method according to claim 1 further comprising collecting the tubular material with a rotating collection device.

14. The method according to claim 1 wherein the composition of the matrix solution and the composition of the inner streaming fluid are selected such that solidification is initiated when the tubular sheath of matrix solution emerges from the common central outlet.

15. The method according to claim 14 wherein the matrix solution is a polymerizable matrix solution, wherein the inner streaming fluid comprises a crosslinking agent that initiates crosslinking of the polymerizable matrix solution.

16. The method according to claim 1 wherein the matrix solution comprises a payload.

17. The method according to claim 16 wherein the payload comprises one or more of fluorescent molecules, one or more assay reagents, chromophores, nanoparticles, microparticles, microgels, medicaments and drug delivery vehicles.

18. The method according to claim 16 wherein the payload comprises one or more cells.

19. The method according to claim 18 wherein the cells include one or more of cardiomyocytes, epithelial cells, tracheal smooth muscle cells, fibroblasts, undifferentiated cells, fungi, viruses, phytoplankton, algae, microorganisms, bacteria, and luminescent bacteria.

20. The method according to claim 18 wherein at least one of the inner streaming fluid and the polymerizable matrix solution has a composition for promoting viability of the cells.

21. The method according to claim 16 wherein the payload is selected from the group consisting of DNA, RNA, antibodies, biological molecules, proteins, growth factors, and cytokines.

22. A microfluidic device comprising:
at least two planar microfluidic layers, each planar microfluidic layer comprising a pair of parallel planar surfaces, wherein said planar microfluidic layers are provided in a stacked configuration, said at least two planar microfluidic layers comprising:
a planar inner streaming fluid microfluidic layer for flowing an inner streaming fluid; and
a planar matrix microfluidic layer for flowing a matrix solution;
wherein said planar matrix microfluidic layer is provided adjacent to said planar inner streaming fluid microfluidic layer;
wherein each planar microfluidic layer comprises at least one microfluidic channel in fluid communication a common central outlet, such that fluid flow in each planar microfluidic layer is parallel to said planar surfaces and is directed inwardly from a peripheral region towards, and distributed around, the common central outlet, and such that a tubular sheath of matrix solution is extruded from said common central outlet in a direction that is angled relative said planar surfaces; and
wherein said planar microfluidic layers are configured such that the inner streaming fluid flows within a lumen defined by the tubular sheath of matrix solution, thereby guiding the tubular sheath of matrix solution.

23. The microfluidic device according to claim 22 further comprising a planar outer streaming fluid microfluidic layer for flowing an outer streaming fluid, wherein the planar outer streaming fluid microfluidic layer is provided adjacent to the planar matrix microfluidic layer, such that the planar matrix microfluidic layer lies between the planar inner streaming fluid microfluidic layer and the planar outer streaming fluid microfluidic layer;
wherein the planar outer streaming fluid microfluidic layer comprises at least one microchannel in fluid communication with the common central outlet, and such that the outer streaming fluid externally envelops the tubular sheath of matrix solution, thereby guiding the tubular sheath of matrix solution.

24. The microfluidic device according to claim 22 further comprising a guiding conduit having a guiding lumen in fluid communication with said common central outlet for guiding the tubular sheath of matrix solution emerging from said common central outlet.

25. The microfluidic device according to claim 24 wherein said guiding conduit comprises a longitudinal axis that is coaxial with said common central outlet.

26. The microfluidic device according to claim 22 wherein said common central outlet is circular.

27. The microfluidic device according to claim 22 further comprising one or more additional planar matrix microfluidic layers for forming one or more additional layers of the tubular sheath of matrix solution.

28. The microfluidic device according to claim 22 wherein at least one of the planar microfluidic layers comprises a microfluidic channel surrounding said common central outlet, said microfluidic channel having a gap formed therein for providing fluidic resistance to a fluid flowing through the microfluidic channel toward the central outlet.

29. The microfluidic device according to claim 22 wherein the planar matrix microfluidic layer comprises a microfluidic array, said microfluidic array comprising an array of microfluidic channels distributed around the common central outlet.

30. The microfluidic device according to claim 29 wherein the array of microfluidic channels are configured to produce fluidic resistance for achieving an even distribution of fluid around the common central outlet.

31. A microfluidic system for forming tubular polymeric structures, comprising:
 a microfluidic device provided according to claim 22;
 an inner streaming dispensing device for dispensing the inner streaming fluid to said planar inner streaming fluid microfluidic layer; and
 one or more matrix dispensing devices for dispensing matrix solution to said planar matrix microfluidic layer.

32. The microfluidic system according to claim 31 wherein the planar matrix microfluidic layer comprises a microfluidic array, said microfluidic array comprising an array of microfluidic channels distributed around the common central outlet.

33. The microfluidic system according to claim 32 wherein each microfluidic channel of said microfluidic array are connected to a common matrix dispensing device for delivering a common matrix solution to the array of microfluidic channels.

34. The microfluidic system according to claim 31 further comprising a control unit interfaced with at least one matrix dispensing device.

35. The microfluidic device according to claim 34 wherein said control unit is configured to controlling the flow rate of the dispensed matrix solution.

36. The microfluidic system according to claim 34 wherein said control unit is configured to controlling the composition of the dispensed polymerizable matrix solution.

37. The microfluidic device according to claim 34 wherein the planar matrix microfluidic layer comprises a microfluidic array, said microfluidic array comprising an array of microfluidic channels distributed around the common central outlet, and wherein two or more dispensing devices are provided for dispensing different matrix solutions to different microchannels of said microfluidic array, such that the tubular material is formed with a heterogeneous cross-sectional composition.

38. The microfluidic system according to claim 31 wherein said microfluidic device comprises one or more additional planar matrix microfluidic layers, said microfluidic system further comprising additional matrix dispensing devices for dispensing different matrix fluids to each additional planar matrix microfluidic layer, such that the tubular sheath of matrix solution comprises multiple layers formed from the different matrix solutions.

39. The microfluidic system according to claim 31 further comprising a rotating collection mechanism configured for collecting the tubular material.

40. The microfluidic system according to claim 31 further comprising a reservoir in flow communication with said common central outlet for receiving and solidifying the tubular sheath of matrix solution extruded from the common central outlet.

* * * * *